(12) United States Patent
Keehr

(10) Patent No.: US 10,187,120 B1
(45) Date of Patent: *Jan. 22, 2019

(54) TUNABLE MICROWAVE NETWORK AND APPLICATION TO TRANSMIT LEAKAGE CANCELLATION CIRCUIT IN AN RFID INTERROGATOR

(71) Applicant: Superlative Semiconductor, LLC, Carlsbad, CA (US)

(72) Inventor: Edward A. Keehr, Carlsbad, CA (US)

(73) Assignee: SUPERLATIVE SEMICONDUCTOR, LLC, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/899,759

(22) Filed: Feb. 20, 2018

Related U.S. Application Data

(63) Continuation of application No. 15/153,422, filed on May 12, 2016, now Pat. No. 9,900,060.

(Continued)

(51) Int. Cl.
*H04B 5/00* (2006.01)
*G06K 7/10* (2006.01)
(Continued)

(52) U.S. Cl.
CPC ....... *H04B 5/0062* (2013.01); *G06K 7/10316* (2013.01); *G06K 19/07775* (2013.01);
(Continued)

(58) Field of Classification Search
CPC ............. H04B 5/0062; G06K 7/10316; G06K 19/07775; H01P 5/18; H01P 1/184; H03H 7/185; H03H 7/383; H03H 2210/025
See application file for complete search history.

(56) References Cited

U.S. PATENT DOCUMENTS

| 5,034,708 A | 7/1991 | Adamian et al. |
| 5,276,411 A | 1/1994 | Woodin, Jr. et al. |

(Continued)

FOREIGN PATENT DOCUMENTS

| CN | 202362811 | 8/2012 |
| WO | WO 2009104839 | 8/2009 |

OTHER PUBLICATIONS

Zobel, O. J., "Theory and Design of Uniform and Composite Electric Wave Filters", Bell Systems Technical Journal, vol. 2 (1923), pp. 1-46.

(Continued)

*Primary Examiner* — Patrick Edouard
*Assistant Examiner* — Eboni Hughes
(74) *Attorney, Agent, or Firm* — Knobbe, Martens, Olson & Bear LLP

(57) ABSTRACT

A tunable microwave network and its application in a radio transceiver transmit signal cancellation network is described. The tunable microwave network realizes a large set of reflection coefficients over a predefined area in the complex reflection coefficient plane for the purpose of reflecting a variable cancellation signal which, when properly configured, results in the substantial attenuation of transmit reflection and transmit leakage signal at the radio transceiver receiver input. A relevant building block of the proposed tunable microwave network is a shunt tunable capacitive element coupled to another shunt tunable capacitive element through a phase shifting element with phase shift greater than 30 degrees divided by a quantity substantially similar to the total number of said tunable capacitive elements and less than 60 degrees at a predefined frequency.

20 Claims, 16 Drawing Sheets

Related U.S. Application Data

(60) Provisional application No. 62/160,227, filed on May 12, 2015, provisional application No. 62/263,922, filed on Dec. 7, 2015.

(51) Int. Cl.
  *G06K 19/077* (2006.01)
  *H01P 1/18* (2006.01)
  *H01P 5/18* (2006.01)
  *H03H 7/38* (2006.01)
  *H03H 7/18* (2006.01)

(52) U.S. Cl.
  CPC ............... *H01P 1/184* (2013.01); *H01P 5/18* (2013.01); *H03H 7/185* (2013.01); *H03H 7/383* (2013.01); *H03H 2210/025* (2013.01)

(56) References Cited

U.S. PATENT DOCUMENTS

| | | | |
|---|---|---|---|
| 6,930,564 B2 | 8/2005 | Verspecht | |
| 7,646,268 B1 | 1/2010 | Tsironis | |
| 8,013,715 B2 | 9/2011 | Chiu et al. | |
| 8,410,905 B2 | 4/2013 | Song et al. | |
| 9,900,060 B1 | 2/2018 | Keehr | |
| 2006/0098765 A1 | 5/2006 | Thomas et al. | |
| 2007/0089513 A1* | 4/2007 | Rosenau | G01D 5/24 |
| | | | 73/514.32 |
| 2009/0036082 A1 | 2/2009 | Sajid | |
| 2012/0091820 A1* | 4/2012 | Campanella | B60L 11/182 |
| | | | 307/104 |
| 2014/0248837 A1* | 9/2014 | Zhou | H04B 1/0458 |
| | | | 455/41.2 |
| 2015/0108210 A1 | 4/2015 | Zhou | |
| 2016/0112028 A1 | 4/2016 | Baier | |

OTHER PUBLICATIONS

Koller, et al., "Adaptive carrier suppression for UHF RFID using digitally tunable capacitors", Microwave Conference (EuMC), 2013 European, Year: 2013, pp. 943-946.

Leake, B.W., "A Programmable Load for Power and Noise Characterization", Microwave Symposium Digest, 1982 IEEE MTT-S International, Year: 1982, pp. 348-350, DOI:10.1109/MWSYM.1982.1130715.

Albinsson, et al., "A new programmable load for noise parameter determination", IEEE Transactions on Microwave Theory and Techniques, Year: 1991, vol. 39, Issue: 2.

Klapproth, et al., "A Programmable Load for Noise Characterization", ARFTG Conference Digest—Spring, 49th, Year: 1997, vol. 31, pp. 155-160, DOI: 10.1109/ARFTG.1997.327224.

Bae, et al., "A Programmable Impedance Tuner With Finite SWRs for Load-Pull Measurement of Handset Power Amplifiers", IEEE Microwave and Wireless Components Letters, Year: 2015, vol. 25, Issue: 4.

Jung, et al., "TX Leakage Cancellation via a Micro Controller and High TX-to-RX Isolations Covering a UHF RFID Frequency Band of 908-914MHz", IEEE Microwave and Wireless Components Letters, vol. 18, No. 10, Oct. 2008.

* cited by examiner

TUNABLE MICROWAVE NETWORK AND APPLICATION TO TRANSMIT LEAKAGE CANCELLATION CIRCUIT IN AN RFID INTERROGATOR

PRIORITY INFORMATION

This application is a continuation of U.S. patent application Ser. No. 15/153,422, titled "TUNABLE MICROWAVE NETWORK AND APPLICATION TO TRANSMIT LEAKAGE CANCELLATION CIRCUIT IN AN RFID INTERROGATOR," filed May 12, 2016, now issued as U.S. Pat. No. 9,900,060, and claims priority to and benefit of U.S. provisional patent application Ser. No. 62/160,227, titled "SIGNAL CANCELLATION IN AN RFID TRANSCEIVER," filed May 12, 2015, and U.S. provisional patent application Ser. No. 62/263,922, titled "RFID SYSTEM TX CANCELLATION CIRCUIT AND METHODOLOGY," filed Dec. 7, 2015, all of which applications are incorporated herein by reference in their entirety for all purposes.

BACKGROUND

Field

This application relates to electronic transceivers, particularly in the context of radio frequency identification ("RFID") or microwave transceivers.

Description of the Related Art

RFID is a technology utilized widely within the shipping, retail, and various other industries. An RFID system can include one or more RFID tags and one or more RFID interrogator transceivers. The RFID tags can receive an electromagnetic signal (such as a radio signal) from an RFID interrogator transceiver, and that signal can cause the RFID tag to emit an electromagnetic signal at a substantially similar frequency as that of the RFID interrogator transceiver output signal, containing information encoded on the RFID tag. In some embodiments, the RFID tags can be passive RFID tags that are powered by the signal from the RFID interrogator transceiver, such that they do not need their own power source.

An example RFID tag contains a microchip and radio antenna encased in plastic. The RFID tag microchip contains special circuitry to extract energy from the incident electromagnetic waveform (e.g., from an RFID interrogator transceiver) and to use this energy to power the remainder of the RFID tag microchip. The RFID tag microchip contains a number of circuit blocks including a nonvolatile memory block which contains information regarding the item to which the RFID tag is affixed. Once the RFID tag microchip is powered up, the information residing in the nonvolatile memory block is often transmitted back to the RFID interrogator transceiver through a process known as backscattering. Backscattering occurs when the RFID tag modulates the termination impedance of its antenna(s), generating a reflected electromagnetic wave signal which the RFID interrogator transceiver can detect.

The signal emitted from the RFID tag can be received by the RFID interrogator transceiver. This information can then be used for a variety of purposes, such as to identify an item, locate an item, or provide general information.

Unfortunately, the information in the signal may be difficult to recover due to noise in the signal that can come from sources external to the transceiver, or sources internal to the transceiver. Similar problems can be found in other transceiver systems, operating at different frequencies, such as radio detection and ranging ("RADAR") systems.

SUMMARY

An example RFID system is depicted in FIG. 1. In a typical RFID system, an RFID tag 160 can be affixed to an item of interest. An RFID interrogator comprising an RFID interrogator transceiver 110 (or alternatively, separate transmitting and receiving elements) extracts information from the RFID tag 160 by transmitting a transmitter output signal T.S. from a transmitting element 120 through a coupling element 140 and through a radiating element 150. In FIG. 1, the coupling element 140 comprises a directional coupler 142 with a terminating element 145, although other coupling elements can also be used such as a hybrid coupler or a circulator. The radiating element 150 is depicted as a single antenna, although multiple antennas could also be used. The terminating element 145 is depicted as having a termination impedance of 50 Ohms, which for a 50 Ohm directional coupler ensures that signal reflections from port 3 of the directional coupler are substantially eliminated. The RFID tag 160 is energized by the large (for example, 0.1 W-2 W) transmitter output signal T.S. and backscatters a portion of the energy from the transmitter output signal T.S. back to the RFID interrogator as a tag returned signal R.S. The tag returned signal R.S. is received by the radiating element 150, passes through the coupling element 140, and is received by the input of receiving element 130. The receiving element 130 processes the tag returned signal R.S. such that the relevant information therein can be suitably decoded by a subsequent system or by the receiving element itself. Using such a system, the RFID interrogator can extract information from the tag returned signal R.S. For example, the RFID interrogator can extract information stored on the RFID tag (e.g., in the form of bits), such as information regarding the object to which RFID tag 160 is attached. Furthermore, the waveform characteristics present in tag returned signal R.S. can provide information regarding the distance of RFID tag 160 to the RFID interrogator, information regarding the position in space of RFID tag 160, or other information.

RFID interrogators can be designed with a single radiating element such as radiating element 150 in FIG. 1. Said radiating element can be coupled to both the transmitting element 120 and receiving element 130 in such a way as to substantially isolate the input of the receiving element 130 from the effects of the transmitter output signal T.S. However, because of the finite reflection coefficient of the radiating element 150, some of transmitter output signal T.S. is reflected back into the input of the receiving element 130 as transmit reflection signal F.S. Along with transmit reflection signal F.S., a transmit leakage signal (from the transmitter output signal T.S. leaking through the coupling element 140) and other effects can result in substantial energy from the transmitter output signal T.S. appearing at the receiving element input. This energy can then cause errors in decoding the information contained in the tag backscatter signal that would be absent in the case where no transmit signal energy were present at the receiving element input.

Corruption of the tag returned signal R.S. is depicted in FIG. 2, in which the frequency domain plot 210 depicts the transmitter output signal T.S. as a double-sided power spectral density with negative and positive frequency components 211a and 211b centered at frequencies $-f_T$ and $+f_T$, respectively. Note that this plot can also be generalized to represent the transmitter signal at baseband if, for example, $f_T$ is set to equal 0 in the case of a direct conversion transceiver, in which case negative and positive frequency components 211a and 211b coincide and are both centered at the zero frequency. On the other hand, when transmitted over the air to the RFID tag, $f_T$ may be equal to a frequency substantially similar to 900 MHz. Each of the positive and negative frequency components 211a and 211b can include a central lobe relating to amplitude modulation signaling, and side skirts relating to phase noise and other noise signals. Frequency domain plot 220 depicts the tag returned signal R.S. as being comprised of tag backscatter modulation components 221-222 and 223-224, with each modulation component separated from $+f_T$ or $-f_T$ by an offset frequency $f_R$. Although the tag returned signal may also contain components similar to T.S., the tag information of interest can primarily reside in backscatter modulation components 221-224, which are shown by themselves for the sake of simplicity. Frequency domain plot 230 depicts the signal at the input of the receiver element. Transmit reflection signal F.S. components 231a and 231b can be considerably larger than tag backscatter modulation components 232-235. The transmit leakage signal coupled from other locations in the system is not depicted in frequency domain plot 230 because it is substantially similar to transmit reflection signal F.S. components 231a and 231b with the potential notable exceptions of phase and amplitude deviations.

Also depicted in frequency domain plot 230 are bandpass filter masks 236-239 which represent bandpass filtering that can take place in receiving element 130 or elsewhere prior to the final bit decision. The bandpass filters represented by masks 236-239 attenuate nonessential portions of the receiving element input signal on a frequency-selective basis (or other bases), leaving a signal with a frequency domain plot 240, for example.

In the frequency domain plot 240, the tag backscatter modulation components 241-244 are still present, but are rivaled in total power by the residual energy components 245-248 from the transmit reflection signal F.S. If the residual energy components 245-248 are too large relative to the tag backscatter modulation components 241-244, then the rate of errors in decoding the information contained in the tag backscatter signal can become unacceptably high. Because the residual energy from the transmit reflection signal and other transmit signal components at the receiving element input is proportional to the total transmit signal energy at the receiving element input, it may be desirable to substantially reduce the transmit signal components at the receiving element input. Doing so can permit successful demodulation of the tag backscatter information in the presence of lower tag backscatter energy than otherwise, allowing, for example, a greater operational range between the RFID tag and interrogator. Thus, it can be desirable to provide a transmit leakage cancellation circuit which enables an RFID interrogator transceiver to substantially reduce the transmit signal energy at the receiving element input.

In one aspect, the devices described herein relate to a transmit leakage cancellation circuit providing a coupling means for coupling both a transmitting element output and a receiving element input to a common radiating element in such a fashion that the transmitting element output signal of the transmitting element output experiences substantial attenuation from the transmitting element output to the receiving element input, with the substantial attenuation exceeding the attenuation from the common radiating element to the receiving element input. The coupling means includes a four port directional coupler with one port coupled to the transmitting element output. This one port coupled to the transmitting element output is thereafter denoted as the input port of the four port directional coupler, relative to which the nomenclature of the remaining three ports are defined. The four port directional coupler has a transmitted port defined with respect to the input port, a coupled port defined with respect to the input port, and an isolated port defined with respect to the input port. The transmitted port is coupled to the common radiating element. The isolated port is coupled to the receiving element input. The coupled port is coupled to at least one tunable microwave network which includes a first tunable capacitive element, at least one second tunable capacitive element, at least one phase shifting element with a phase shift greater than 30 degrees divided by a quantity substantially similar to the total number of said tunable capacitive elements and less than 60 degrees at at least one predetermined frequency, a tuning means to actuate at least one of the tunable capacitive elements to produce a plurality of reflection coefficients, and with the first tunable capacitive element electrically coupled to the at least a second tunable capacitive element through the at least one phase shifting element.

In one embodiment, the at least one tunable microwave network includes a static load coupled to the first tunable capacitive element. The static load has a complex impedance that is advantageous for shifting the plurality of reflection coefficients to a predetermined area on the complex reflection coefficient plane.

In another embodiment, the first tunable capacitive element or the at least one second tunable capacitive element includes at least one digitally tunable capacitor.

In yet another embodiment, the at least one phase shifting element includes at least one microwave transmission line.

In yet another embodiment, the at least one phase shifting element includes at least one lumped transmission line or subsection thereof.

In yet another embodiment, the at least one phase shifting element includes an inductor disposed in series between the first tunable capacitive element and the second tunable capacitive element.

In yet another embodiment, at least one of the first tunable capacitive element or the at least second tunable capacitive element includes another tunable capacitive element electrically coupled to the tunable microwave network through an impedance transforming network.

In yet another embodiment, the impedance transforming network includes at least one inductive transformer.

In yet another embodiment, the another tunable capacitive element coupled in series with a resonating capacitive element substantially resonating with the residual series inductance of the at least one inductive transformer at the at least one predetermined frequency.

In yet another embodiment, the impedance transforming network includes at least one inductive divider.

In yet another embodiment, the another tunable capacitive element coupled in series with a resonating capacitive element substantially resonating with the residual series inductance of the at least one inductive divider at the at least one predetermined frequency.

In yet another embodiment, the at least one tunable microwave network includes a fixed capacitive element disposed between the phase shifting element and at least one of the first tunable capacitive element or the at least one second tunable capacitive element whereby the maximum geometric distance between reflection coefficients within the said plurality of reflection coefficients is reduced relative to the case in which the tunable capacitive element is coupled directly to the at least one phase shifting element.

In another aspect, the devices described herein relate to a tunable microwave network for establishing a plurality of reflection coefficients at an at least one predetermined frequency. The tunable microwave network includes a first tunable capacitive element, at least one second tunable capacitive element, at least one phase shifting element with a phase shift greater than 30 degrees divided by a quantity substantially similar to the total number of said tunable capacitive elements and less than 60 degrees at the at least one predetermined frequency, and a tuning means to actuate at least one of the tunable capacitive elements to produce a plurality of reflection coefficients. The first tunable capacitive element is electrically coupled to the at least one second tunable capacitive element through the at least one phase shifting element.

In one embodiment, the at least one tunable microwave network includes a static load coupled to the first tunable capacitive element. The static load has a complex impedance that is advantageous for shifting the plurality of reflection coefficients to a predetermined area on the complex reflection coefficient plane.

In another embodiment, the first tunable capacitive element or the at least one second tunable capacitive element includes at least one digitally tunable capacitor.

In yet another embodiment, the at least one phase shifting element includes at least one microwave transmission line.

In yet another embodiment, the at least one phase shifting element includes at least one lumped transmission line or subsection thereof.

In yet another embodiment, the at least one phase shifting element includes an inductor disposed in series between the first tunable capacitive element and the second tunable capacitive element.

In yet another embodiment, at least one of the first tunable capacitive element or the at least second tunable capacitive element includes another tunable capacitive element electrically coupled to the tunable microwave network through an impedance transforming network.

In yet another embodiment, the impedance transforming network includes at least one inductive transformer.

In yet another embodiment, the another tunable capacitive element coupled in series with a resonating capacitive element substantially resonating with the residual series inductance of the at least one inductive transformer at the at least one predetermined frequency.

In yet another embodiment, the impedance transforming network includes at least one inductive divider.

In yet another embodiment, the another tunable capacitive element coupled in series with a resonating capacitive element substantially resonating with the residual series inductance of the at least one inductive divider at the at least one predetermined frequency.

In yet another embodiment, the tunable microwave network includes a fixed capacitive element disposed between the at least one phase shifting element and at least one of the first tunable capacitive element or the at least one second tunable capacitive element whereby the maximum geometric distance between reflection coefficients within the said plurality of reflection coefficients is reduced relative to the case in which the tunable capacitive element is coupled directly to the at least one phase shifting element.

In yet another aspect, the devices described herein relate to a method of establishing a plurality of reflection coefficients at at least one predetermined frequency including providing a first tunable capacitive element, providing at least one second tunable capacitive element, providing at least one phase shifting element with a phase shift greater than 30 degrees divided by a quantity substantially similar to the total number of said tunable capacitive elements and less than 60 degrees at the at least one predetermined frequency, providing a tuning means to actuate at least one of the tunable capacitive elements to produce a plurality of reflection coefficients, and electrically coupling first tunable capacitive element to the at least one second tunable capacitive element through the at least one phase shifting element.

In a further aspect, an RFID interrogator transceiver includes a directional coupler with an antenna operatively coupled to the transmitted port of the directional coupler. A signal source can be operatively coupled to the input port of the directional coupler to provide an output signal through the antenna. A signal receiver can be operatively coupled to the isolated port of the directional coupler to receive an input signal from the antenna. A tunable microwave network can be operatively coupled to the coupled port of the directional coupler. The tunable microwave network can include a phase shifting element operatively coupled to the coupled port. Further, the tunable microwave network can include a first tunable capacitive element operatively coupled to the coupled port through the phase shifting element in a shunt configuration between the phase shifting element and ground. The tunable microwave network can also include a second tunable capacitive element operatively coupled to the coupled port, in a shunt configuration between the phase shifting element and ground. The RFID interrogator transceiver can also include a control unit configured to adjust a capacitance of the first and second tunable capacitive elements.

In a further aspect, a method for operating a RFID interrogator transceiver can be provided. A first microwave signal can be emitted through an antenna. A second microwave signal can then be received with the antenna, the second microwave signal comprising a RFID tag signal generated in response to receiving the first microwave signal. Along with this second microwave signal, the receiving element of the RFID interrogator transceiver also receives an intrinsic internal-reflection signal generated by other components of the RFID interrogator transceiver in response to the first microwave signal. The combined received signal can be measured to estimate at least one component of the internal-reflection signal. At least two tunable capacitive elements operatively coupled to each other through a series phase shifting element and operatively coupled to the antenna to generate a cancelling internal-reflection signal can then be automatically adjusted to substantially attenuate the intrinsic internal-reflection signal in response to the first microwave signal.

The foregoing and other objects, aspects, features, and advantages of the devices and methods described herein will become more apparent from the following description and from the claims.

BRIEF DESCRIPTION OF THE DRAWINGS

For a more complete understanding of the devices and methods described herein, reference is made to the following description and accompanying drawings, in which.

DETAILED DESCRIPTION

Figure 3:
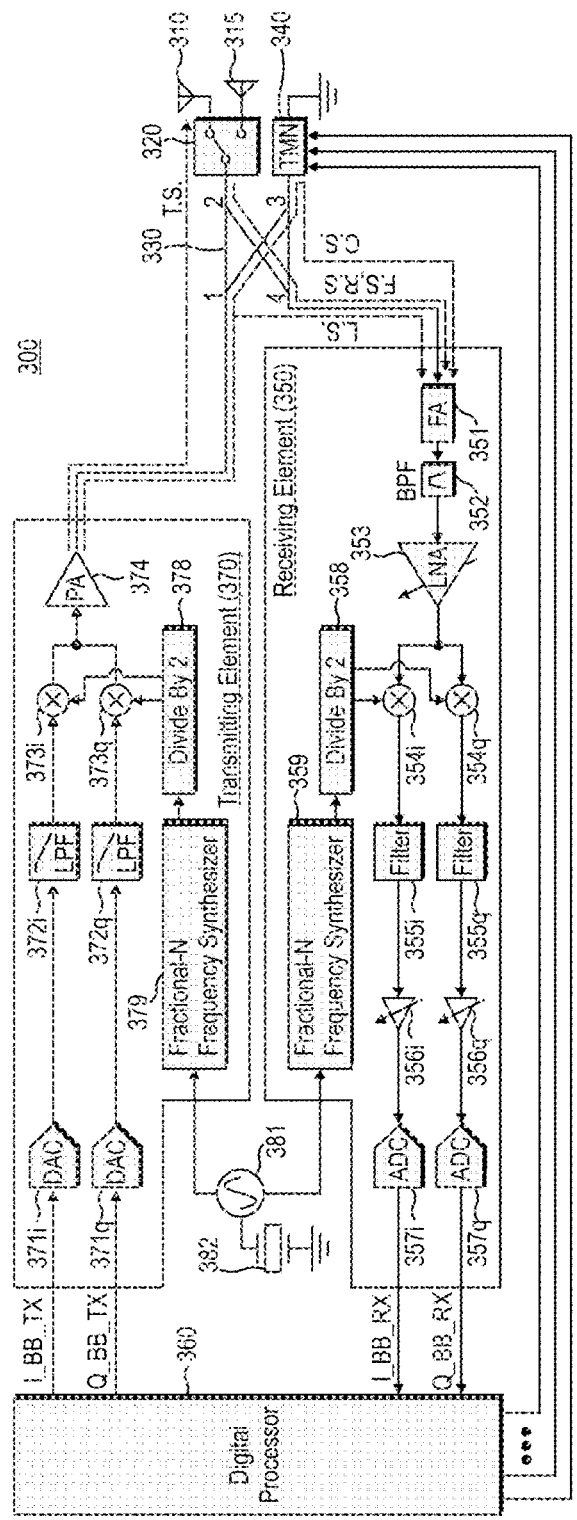
FIG. 3 is a block diagram of a RFID interrogator transceiver employing a tunable microwave network at the coupling port of a differential coupler.

A block diagram of a RFID interrogator transceiver 300 is depicted in FIG. 3. In this embodiment, the radiating element is comprised of multiple antennas 310 and 315, and an RF switch 320. Such an arrangement, here considered to be a single radiating element, is more general than a single antenna and can permit interrogation of RFID tags in two orthogonal spatial orientations. A single antenna or more than two antennas are also possible.

The single pole of RF switch 320 is coupled to a directional coupler 330. The directional coupler 330 has four ports, numbered 1 to 4. The directional coupler can be a microwave device that can include two coupled transmission lines: a first transmission line from port 1 to port 2, and a second transmission line from port 3 to port 4, although other designs and components are also possible. Further, although many components are described as microwave components, in other embodiments they can be configured to operate with other frequencies.

The diagonal lines from port 2 to port 4 and from port 1 to port 3 reflect the coupling aspect of the directional coupler, where a defined portion of microwave energy from port 1 is coupled to port 3 (and vice versa) and a defined portion of microwave energy from port 2 is coupled to port 4 (and vice versa). In FIG. 3, port 1 is termed the input port, where transmit power is applied. Port 2 is the transmitted port, to which the majority of the power delivered to the input port is coupled. The radiating element is connected to port 2, potentially minimizing the loss between the transmitting element and the radiating element. Port 3 is commonly called the coupled port, and is the port to which a defined amount of energy from the input port is coupled. Port 4 is commonly called the isolated port, with its nomenclature referring to the fact this port is substantially isolated from the input port, provided that port 3 is terminated in a microwave load matched to the second directional coupler transmission line. It should be evident to the interrogator that ports 2 through 4 are all defined with respect to port 1. If port 2 were deemed the input port, then port 4 could be deemed the coupled port. This symmetric nature of the directional coupler facilitates its use as a device to couple both the transmitting element and the receiving element to the radiating element.

Figure 1:
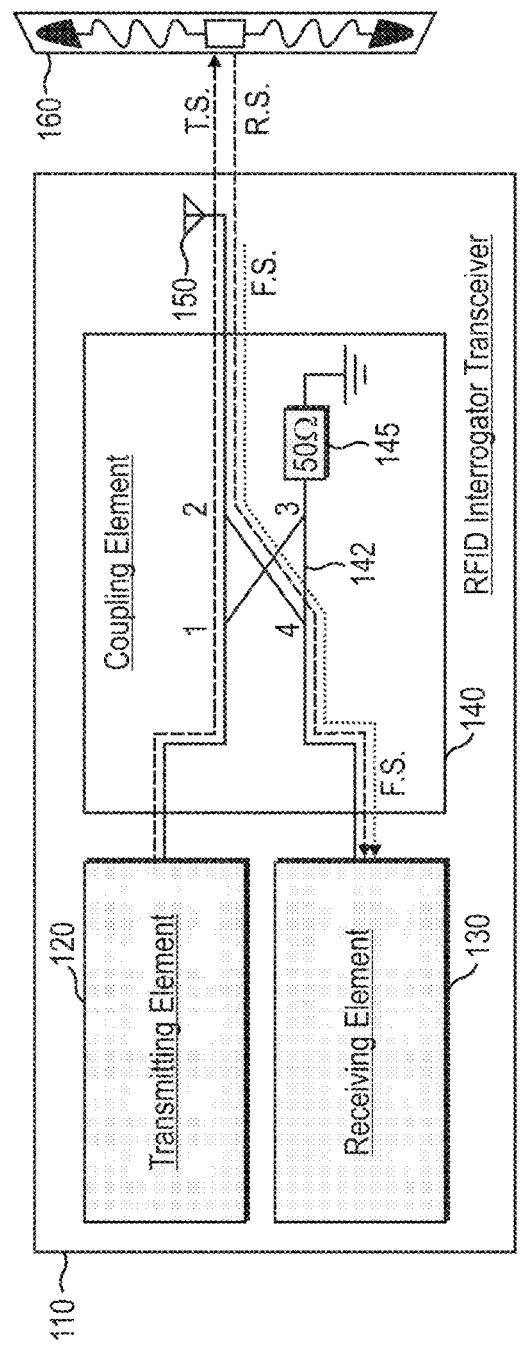
FIG. 1 is a block diagram of a RFID interrogator transceiver.

In order to substantially reduce the transmit signal energy at the input of the receiving element 350, the terminating element 145 from FIG. 1 with static termination impedance of 50 Ohms can optionally be replaced with a tunable microwave network 340, as shown in FIG. 3. A digital processor 360 adjusts the reflection coefficient of the tunable microwave network 340 away from a nominal value of zero, such that signal reflections from port 3 of the directional coupler 330 are not substantially eliminated and are in fact manipulated in order to provide a transmit cancellation signal C.S. which is substantially equal in magnitude and substantially opposite in phase to the vector sum of transmit reflection signal F.S., transmit leakage signal L.S., and any other transmit signal coupled to the input of receiving element 350. When the transmit cancellation signal C.S. is therefore combined with the vector sum of transmit reflection signal F.S., transmit leakage signal L.S., and any other transmit signal coupled to the input of receiving element 350, the transmit signal energy at the input of the receiving element is substantially reduced relative to the case in which C.S. were not present.

The digital processor 360 also generates digital baseband waveforms I_BB_TX and Q_BB_TX containing complex baseband envelope information of the transmit output signal and provides these waveforms to the transmitting element 370. Digital-to-analog converters (DACs) 371$i$ and 371$q$ convert digital baseband waveforms to analog baseband waveforms. Low-pass filters 372$i$ and 372$q$ receive the analog baseband waveforms and substantially attenuate undesirable baseband signal content above a frequency band of interest relative to the desirable portion of the transmit output signal. The filtered analog baseband transmit waveform is then upconverted to microwave frequencies by quadrature mixers 373$i$ and 373$q$, which each receive as an input one of an in-phase or quadrature baseband transmit signal. Each of the quadrature mixers 373$i$ and 373$q$ also receive as an input one of an in-phase or quadrature (approximately 90 degrees phase offset from in-phase) local oscillator signal, further described below. Combining the outputs of mixers 373$i$ and 373$q$ yields a complex modulated radio frequency signal that couples to a power amplifier 374. The power amplifier 374, which may be itself composed of one or more amplifiers, outputs a transmit output signal at high power (for example, approximately 0.1 W to 4 W) so that the RFID tag targeted by the RFID interrogator transceiver 300 receives enough energy to power itself and conduct operations at a predetermined distance from the RFID interrogator transceiver (for example, approximately 1 to 10 meters). As mentioned before, power amplifier 374 is coupled to port 1 of directional coupler 330.

After coupling to the receiving element 350, the receiving input signal passes through a fixed attenuator (FA) 351 and a bandpass filter (BPF) 352. The fixed attenuator 351 can be used to assure that F.S. and L.S. do not exceed the maximum input power limit of the receiving element low noise amplifier (LNA) 353, even when the digital processor 360 has not properly configured the tunable microwave network 340 for substantial transmit signal cancellation, for example. The bandpass filter 352 can be used to substantially attenuate signal content outside of the range of frequencies substantially processed by the RFID interrogator transceiver relative to desired signal content, therefore improving the signal-to-interference ratio of the desired signal. The output of the bandpass filter 352 is coupled to the input of LNA 353.

Figure 2:
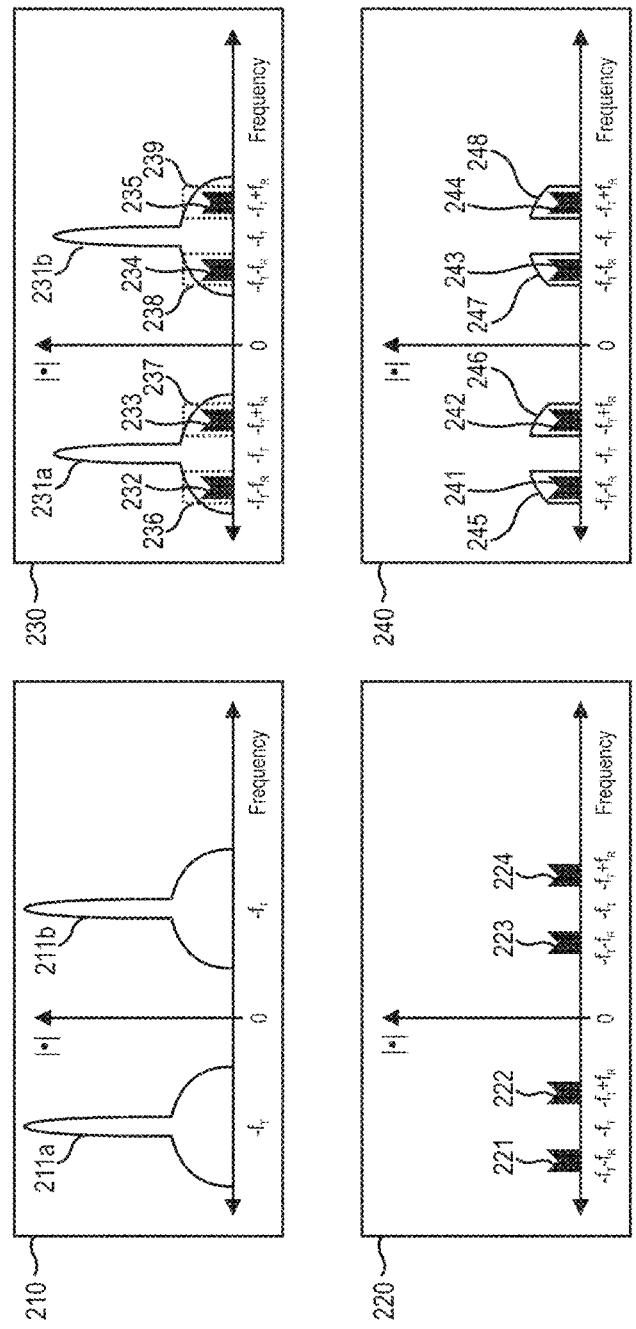
FIG. 2 is a set of frequency domain plots that can result from the transceiver of FIG. 1.

The LNA 353 can have adjustable gain and may be bypassable in the case where the expected receive input signal has an amplitude large enough so as to not warrant amplification. Usually, the purpose of an LNA in a receiving element is to amplify the signal so as to minimize the input-referred noise contribution of the following circuit blocks. The receive signal is downconverted by quadrature mixers 354i and 354q, each of which also receives as an input one of an in-phase or quadrature (approximately 90 degrees phase offset from in-phase) local oscillator signal (further described, below). The local oscillator signals utilized in the receiving element can cycle at approximately the same frequency as do those in the transmitting element 370, discussed above, and can further originate from the same source. The reason for this arrangement is because the receive signal content can be substantially centered around the center frequency $f_T$ of the transmit signal, as depicted in plot 220 of FIG. 2.

Downconverting the receive signal by $f_T$ can move the tag backscatter modulation components of the receive signal to low-intermediate frequencies (low-IF), which can be substantially higher than zero-frequency (DC) offsets and low frequency 1/f noise common in many types of circuits, but also low enough to be easily digitized by moderate-bandwidth analog-to-digital converters of moderate cost (such as those with a sample rate of 32-36 MHz). The received analog baseband signals then pass through filters 355i and 355q. The filters 355i and 355q can be configured to reject both high and low frequency components. Low frequency components that are filtered-out can include significant portions of the downconverted transmit reflection signal and aforementioned 1/f noise. High frequency components that are filtered-out can include RFID signals from other RFID interrogators and other transmitters operating in the same frequency band as RFID interrogators. The outputs of the filters 355i and 355q are coupled to programmable gain amplifiers 356i and 356q, which are in turn coupled to quadrature analog-to-digital converters (ADCs) 357i and 357q. The ADCs 357i and 357q provide digital baseband receive waveforms I_BB_RX and Q_BB_RX to the digital processor 360. The digital processor 360 can then demodulate the digital baseband receive signal in an attempt to recover information, such as a packet of bits, backscattered by the RFID tag.

The quadrature local oscillator signals utilized in both receiving element 350 and transmitting element 370, as discussed above, are generated from a frequency synthesis network comprising transmit divide-by-2 circuit 378, transmit fractional-N frequency synthesizer 379, receive divide-by-2 circuit 358, receive fractional-N frequency synthesizer 359, common reference oscillator 381, and common frequency reference crystal 382. The frequency reference crystal 382 is often a small piece of quartz and is designed to resonate at a specific frequency, such as one between 1 MHz-50 MHz. The reference oscillator 381 drives frequency reference crystal 382 to generate a reference oscillator signal that substantially consists of frequency content at a single frequency within the specified frequency range of the reference crystal. The output of the reference oscillator 381 is coupled to one or more frequency synthesizers, which can optionally be fractional-N in nature. The frequency synthesizers can perform an accurate multiplication of the reference oscillator frequency. The typical quartz reference crystal frequencies range from 1 MHz-50 MHz but a substantial portion of portable RF transceivers such as RFID interrogators utilize local oscillator frequencies of 300-6000 MHz. Thus, this multiplication can be helpful. The multiplication can be integer-N in nature, meaning that the ratio of the local oscillator signal to the reference oscillator signal is substantially an integer, or it can be fractional-N in nature, meaning that the ratio of the local oscillator signal to the reference oscillator signal is substantially similar to a defined fraction. In FIG. 3, the outputs of the fractional-N frequency synthesizers 359 and 379 couple to the divide-by-2 circuits 358 and 378, respectively. As such, the output frequency of the fractional-N frequency synthesizer is substantially similar to twice the local oscillator frequency. This arrangement can permit the use of a higher quality frequency synthesizer oscillator, result in less local oscillator signal coupling to mixer signal inputs, and impose less demanding signal routing requirements relative to the case in which local oscillator signals are generated from the frequency synthesizers directly. Finally, the divide-by-2 circuits provide quadrature local oscillator signals to the mixers in both the transmitting element and the receiving element.

Figure 4:
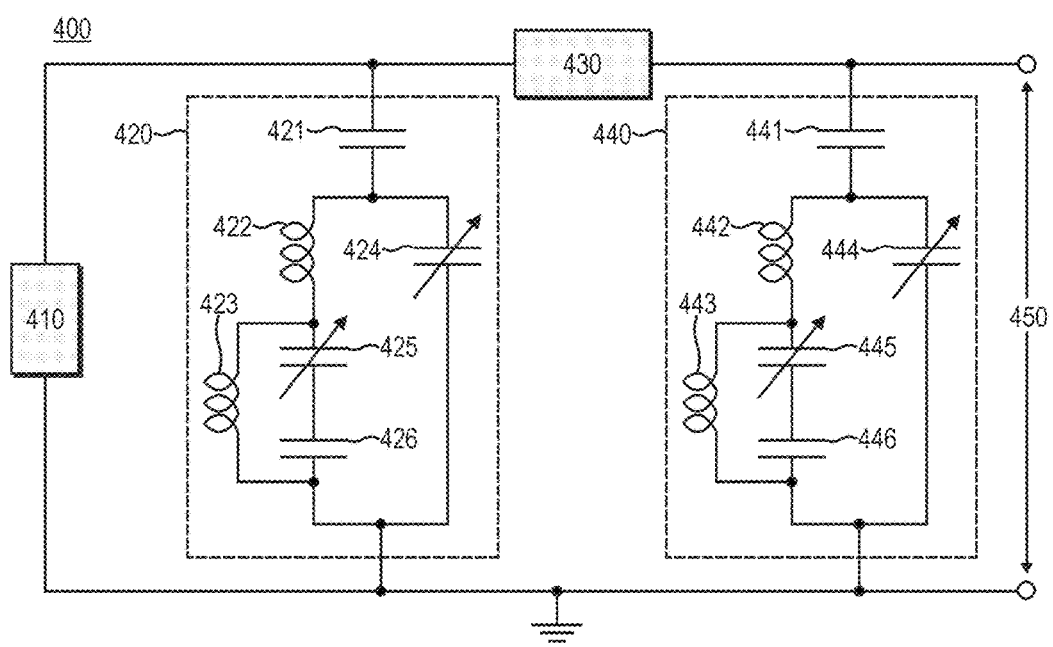
FIG. 4 is a schematic of an embodiment tunable microwave network.

FIG. 4 depicts an embodiment of a tunable microwave network 400 suitable for use in the system of FIG. 3. The design goal of this tunable microwave network 400 is for it to realize at a port 450 any reflection coefficient within a set of desirable reflection coefficients that will provide for substantial attenuation of transmit signal energy at a receiving element input, such as that shown in FIG. 3. In the case where the tunable microwave network can only realize a discrete set of reflection coefficients, one design goal is that the maximum geometric distance from any point within the set of desirable reflection coefficients to the nearest point within the discrete set of realizable reflection coefficients be minimized. This distance will be referred to herein as the maximum error distance. In one embodiment, the set of desirable reflection coefficients can be all of those reflection coefficients within a predetermined geometric distance from a predetermined reflection coefficient. In another embodiment, the predetermined reflection coefficient can be zero, and the set of desirable reflection coefficients can be all those reflection coefficients with magnitude below a predetermined quantity. It should be apparent that for a given cost and maximum error distance, a circuit which can realize a larger set of reflection coefficients than another circuit is a superior circuit. Similarly, for a given cost and set of desirable reflection coefficients, a circuit which can achieve a lower maximum error distance than another circuit is a superior circuit. For large values of antenna reflection coefficients, such as in the case of low quality, low cost antennas, the transmit reflection signal F.S. from FIG. 3 can significantly exceed other components of the transmitter output signal at the receiving element input. In such a case, a possible target set of desirable reflection coefficients to be realized by the tunable microwave network is the set of all reflection coefficients with magnitude less than the magnitude of the maximum reflection coefficient of the radiating element. For a large and useful class of radiating elements, the maximum reflection coefficient can be 0.3, or expressed in decibels, −10 dB.

From left to right, the exemplary tunable microwave network includes an optional load network 410. In one embodiment, this load network may simply be a resistor. In another embodiment, this load network may be a resistor in series with a transmission line. In yet another embodiment, this load network may be a resistor in series with an inductor. Next, a first tunable capacitive element 420 is employed in a shunt configuration between phase shifting element 430 and ground. In the embodiment depicted in FIG. 4, first tunable capacitive element 420 consists of a coarse tunable capacitive element 424, an inductive divider consisting of inductors 422 and 423, a fine tunable capacitive element 425, a fixed resonating capacitive element 426 and a fixed impedance limiting capacitive element 421. Either or both of the coarse tunable capacitive element 424 and the fine tunable capacitive element 425 can be implemented by, or comprise, digitally tunable capacitors. As explained further below in connection with FIG. 5, the impedance of the fine tunable capacitive element 425 is transformed upwards (i.e. the apparent capacitance is made smaller) by the inductive divider consisting of inductors 422 and 423. Once transformed in this fashion and placed in parallel with coarse tunable capacitive element 424, the fine tunable capacitive element can serve as a subranging capacitive element relative to the coarse tunable capacitive element 424. In other words, the coarse tunable capacitive element 424 can make large changes, while the fine tunable capacitive element 425 can make smaller changes, in between values that would be realizable with just the coarse tunable capacitive element. In such an embodiment, the resolution of capacitance values realizable by the first tunable capacitive element 420 can far exceed the resolution of capacitance values realizable by the coarse tunable capacitive element 424 alone. The advantage of this increased resolution is that it makes possible the reduction of maximum error distance below the case in which fine tunable capacitive element 425 does not exist.

In order to create this subranging effect, many transformation techniques may be applied to the fine tunable capacitive element 425 in place of the inductive divider. For example, an inductive transformer may also be utilized for this purpose. In both the cases of an inductive divider and inductive transformer, a residual series inductance appears in series with the fine tunable capacitive element in the equivalent transformed network. This residual series inductance can be substantially resonated out of the network at a predetermined frequency of operation of the network in order for the subranging effect to operate in an intuitive manner. The fixed resonating capacitive element 426 can resonate out this residual series inductance. Further, the fixed impedance limiting capacitive element 421 can limit the minimum shunt impedance of the first tunable capacitive element 420. By doing so, it was found that the set of realizable reflection coefficients could be better confined to a particular predetermined area in the complex reflection coefficient plane, hereafter denoted as the Γ-plane, thus reducing the maximum error distance within this particular predetermined area.

Continuing left to right in FIG. 4, the first tunable capacitive element 420 is coupled to phase shifting element 430, which is in turn coupled to a second tunable capacitive element 440 which, like the first tunable capacitive element 420, is also employed in a shunt configuration. In the depicted embodiment, the architecture of the second tunable capacitive element 440 is substantially similar to that of the first tunable capacitive element 420, but can contain different component values. One effect of the phase shifting element 430 between the two tunable capacitive elements is to provide a degree of orthogonality between the curves traced in the Γ-plane by tuning the capacitances of tunable capacitive elements 420 and 440. As such, an appropriate phase shift for the phase shifting element 430 can be between 15 degrees and 60 degrees. Such a phase shift roughly results in a clockwise rotation of 30 degrees to 120 degrees of the realized reflection coefficients in the Γ-plane, as microwave signals reflected through the tunable microwave network experience this phase shift twice. Although geometric orthogonality is often considered to result from a 90 degree phase shift, in the present context the relevant orthogonality is that between rotated arcs traced out by sweeping the tunable capacitive elements in the Γ-plane, as will be described more fully later. In one embodiment, the phase shifting element 430 can include a transmission line. In another embodiment, the phase shifting element 430 can include a lumped transmission line or subsection thereof. In yet another embodiment, the phase shifting element 430 can include an inductor disposed in series between the two tunable capacitive elements. Note that in this latter case, the inductor, combined with any shunt capacitance to ground at either of its two terminals, can be considered a subsection of a lumped transmission line. In further embodiments, combinations of these phase shifting elements can be used.

Figure 5:
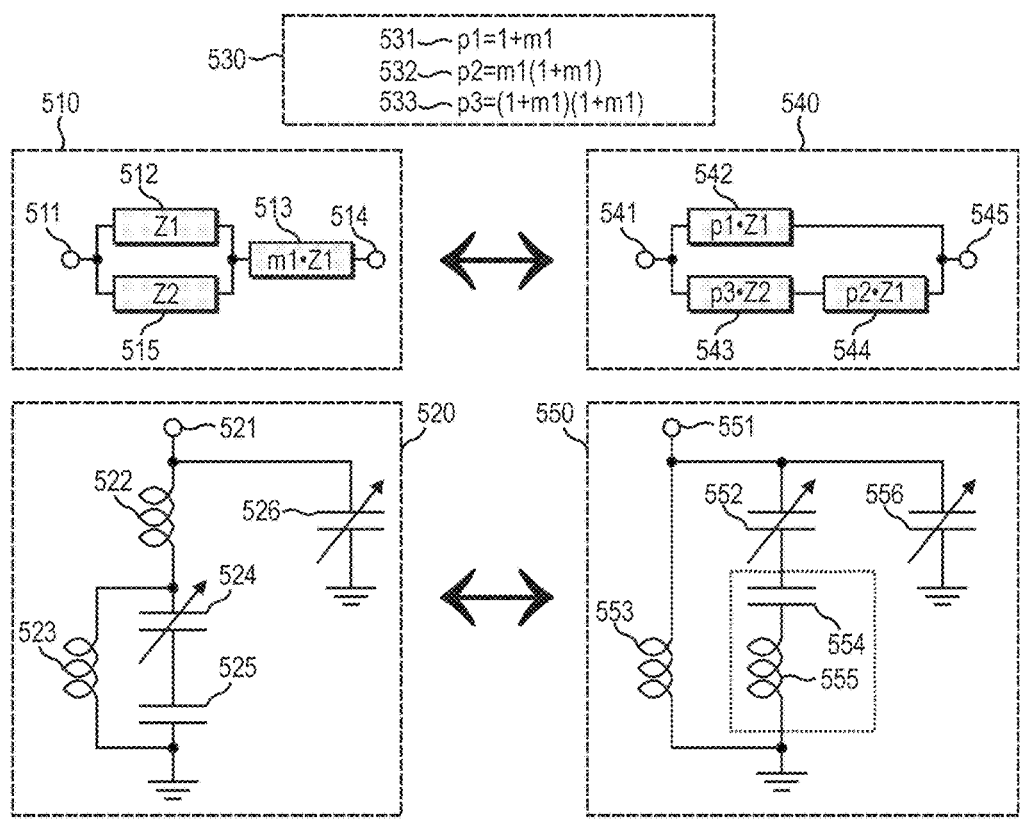
FIG. 5 is a diagram illustrating the impedance transformation applied to a subranging tunable capacitive element within a tunable capacitive element within an embodiment of the tunable microwave network in FIG. 4.

FIG. 5 further explains the tunable capacitive elements 420 and 440. It can be shown mathematically that a first impedance network 510 is equivalent to a second impedance network 540 when the mathematical relations 531-533 in group 530 hold. Further background information regarding these mathematical relations can be found in Zobel, O. J., *Theory and Design of Uniform and Composite Electric Wave Filters*, Bell Systems Technical Journal, Vol. 2 (1923), pp. 1-46, the entirety of which incorporated by reference herein. These mathematical relations can be exploited to create subranging fine tunable capacitive element currently under discussion. In the case of a tunable capacitive element 520, inductors 522 and 523 correspond to impedance elements 513 and 512, respectively. Constant m1 is the ratio of the inductance of inductor 522 to the inductance of inductor 523. As denoted by mathematical relation 533, constant m1 should be roughly 2.1 in order to provide for an order of magnitude (an order of magnitude being roughly equal to 10) increase in impedance of the fine tunable capacitive element, which in equivalent tunable capacitive element 550 is depicted as equivalent fine tunable capacitive element 552. Note that not only does the capacitance value of the equivalent fine tunable capacitive element 552 reflect an impedance transformation, but it now appears directly in series with equivalent inductance 555. In order for equivalent fine tunable capacitive element 552 to appear substantially directly in parallel with equivalent coarse tunable capacitive element 556, it can be advantageous to resonate out equivalent inductance 555 at a predetermined frequency. Doing so enhances the quality of the subranging effect of equivalent fine tunable capacitor 552. For this reason, equivalent fixed resonating capacitive element 554 is disposed in series with equivalent inductance 555. When transformed back into the exemplary embodiment of tunable capacitive element 520, equivalent fixed resonating capacitive element 554 is transformed into fixed resonating capacitive element 525.

Figure 6:
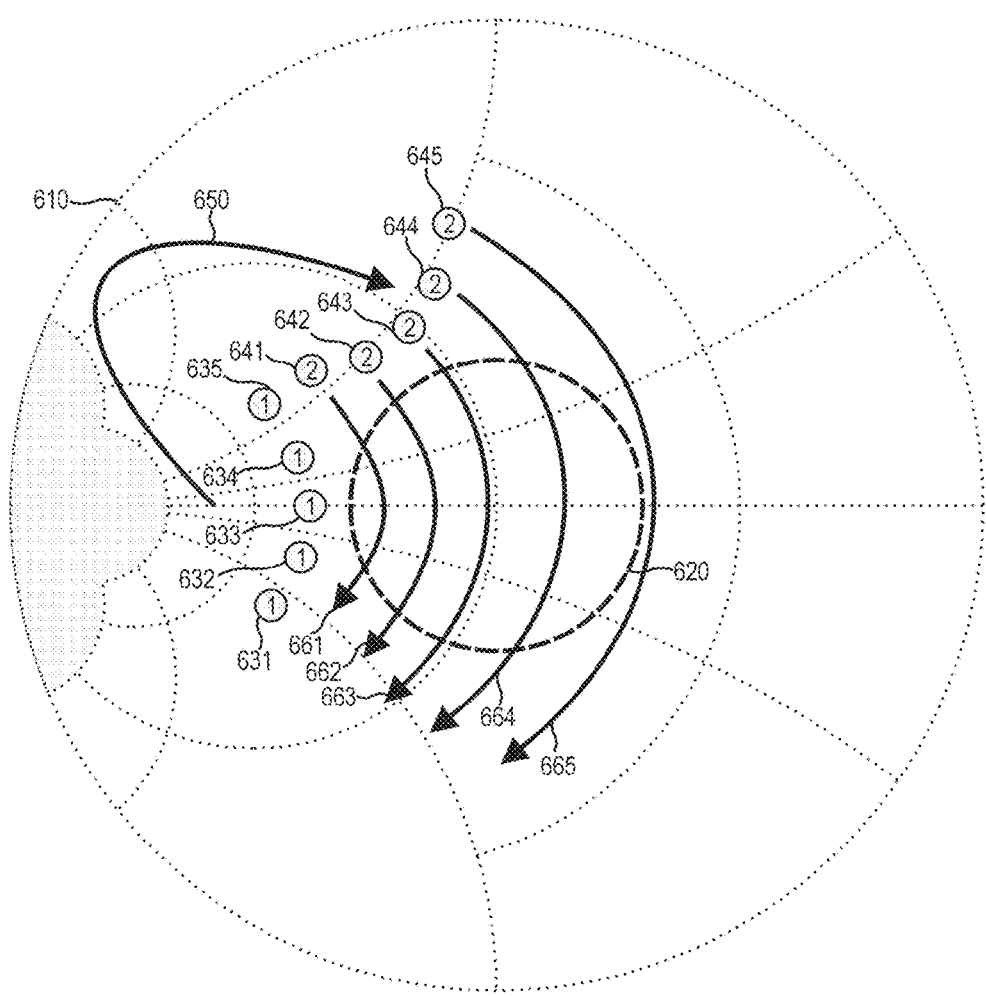
FIG. 6 is a graph illustrating the tunable microwave network in FIG. 4 achieving coverage of reflection coefficients within a predetermined set of reflection coefficients below a predetermined magnitude.

A conceptual depiction of how the tunable microwave network in FIG. 4 achieves reflection coefficient coverage within a predetermined set of desirable reflection coefficients is provided in FIG. 6. Reflection coefficients in a microwave system are often plotted on a graph known as a Smith Chart overlaid on the Γ-plane. For the purposes of the discussions herein, the explanation of the operation of the tunable microwave network in FIG. 4 is perhaps better performed with an admittance Smith Chart 610, depicted in FIG. 6, which is also overlaid on the Γ-plane. In the present example of FIG. 6, the predetermined set of desirable reflection coefficients is contained within the dashed circle 620. The set of points within dashed circle 620 is a suitable set of desirable reflection coefficients for cancelling transmit signal reflected from a radiating element with maximum reflection coefficient equal to 0.3, or −10 dB when expressed in decibels. For the purposes of this depiction, it is assumed that the optional load network 410 includes a resistor with resistance value substantially similar to one-half of the characteristic microwave impedance of the system. In this case, the characteristic microwave impedance of the system is considered to be substantially similar to 50 Ohms. The reflection coefficient of the optional load network 410 can be plotted on admittance Smith Chart 610 as point 633, shifted to the left from the center of the Γ-plane. An example subset of reflection coefficients realizable by the parallel combination of the optional load network 410 and the first tunable capacitive element 420 can be plotted on the admittance Smith Chart 610 as points 631-635. Point 631 corresponds to the condition in which the tunable capacitance of the first tunable capacitive element 420 is at its maximum, while point 635 corresponds to the condition in which the tunable capacitance of the first tunable capacitive element 420 is at its minimum. Point 633 also corresponds to the condition in which the total tunable capacitance in the equivalent tunable capacitive element 550 resonates with the equivalent parallel inductance 553 in FIG. 5. Note that as the shunt capacitance increases, the realized reflection coefficients trace a clockwise arc from point 635 to point 631 along one of the circles contained within admittance Smith Chart 610.

The effect of adding the phase shifting element 430 in series with the parallel combination of the optional load network 410 and the first tunable capacitive element 420 is to substantially rotate points 631-635 clockwise around the center of the admittance Smith Chart 610 to points 641-645, with this substantial rotation depicted by the arc 650. The effect of increasing a shunt capacitance such as the second tunable capacitive element 440 will be to again trace clockwise arcs 661-665 along the circles contained within the admittance Smith Chart 610. If the amount of substantial rotation provided by the phase shifting element 430 is such that a line through the points 641-645 is roughly orthogonal to the circles contained within the admittance Smith Chart 610, the area delimited by clockwise arcs 661-665 will tend to have desirable properties for covering the set of reflection coefficients contained within dashed circle 620. For example, the angle subtended by each of the arcs will be substantially similar such that all of the arcs can have a midpoint substantially close to the real axis of the admittance Smith Chart 610. In addition, the area delimited by clockwise arcs 661-665 will tend to be large for a given starting set of points 641-645 when a line through these points is roughly orthogonal to the circles contained within the admittance Smith Chart 610. Since the set of realizable reflection coefficients will exist within the area delimited by arcs 661-665, this set will also have these desirable properties. For the example two-tunable capacitive element tunable microwave network of FIG. 4, the phase shift required to achieve this rough orthogonality is between 15 and 60 degrees at the predefined frequency of operation.

Figure 7:
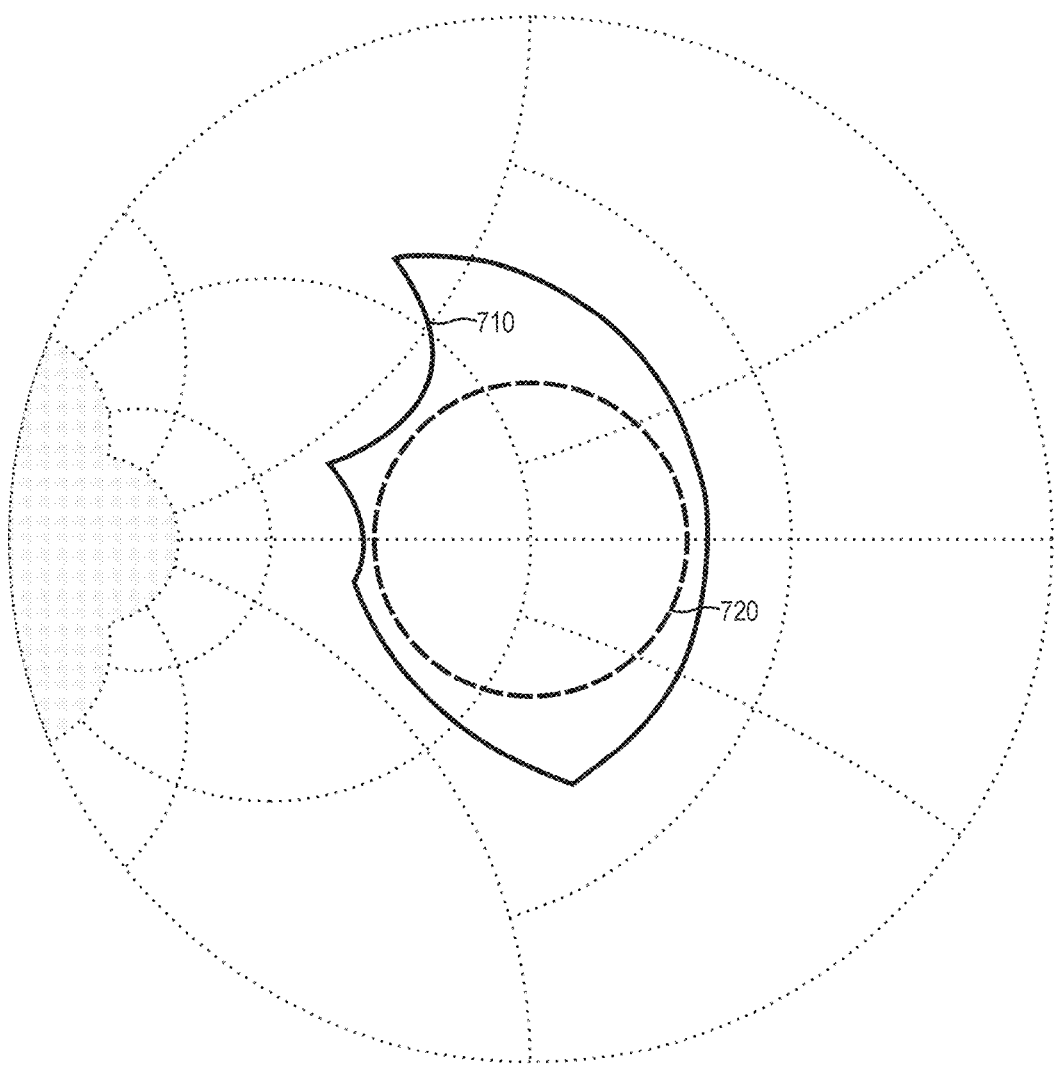
FIG. 7 is a graph illustrating the coverage of reflection coefficients achieved by an embodiment of the tunable microwave network in FIG. 4.

Boundary 710 in FIG. 7 circumscribes the set of all discrete reflection coefficients realized by the example tunable microwave network of the architecture depicted in FIG. 4. As one can see, roughly half of the area circumscribed by boundary 710 is occupied by the predetermined set of reflection coefficients contained within the dashed circle 720, which like dashed circle 620 is a circle centered at the origin with a radius of 0.3. Given that it can be advantageous for boundary 710 to circumscribe dashed circle 720 by some margin due to frequency-dependent shifts of the reflection coefficients, this result implies tight coverage of the predetermined set of reflection coefficients by the exemplary tunable microwave network design.

It will be understood that other areas of reflection coefficients can also be circumscribed by the realizable reflection coefficients, such as areas that are centered at other portions of the Γ-plane, or regions of the Γ-plane that are not circular. Variations on the tunable microwave network and the phase shifting element can allow a wide variety of reflection coefficients to be realizable.

Figure 8:
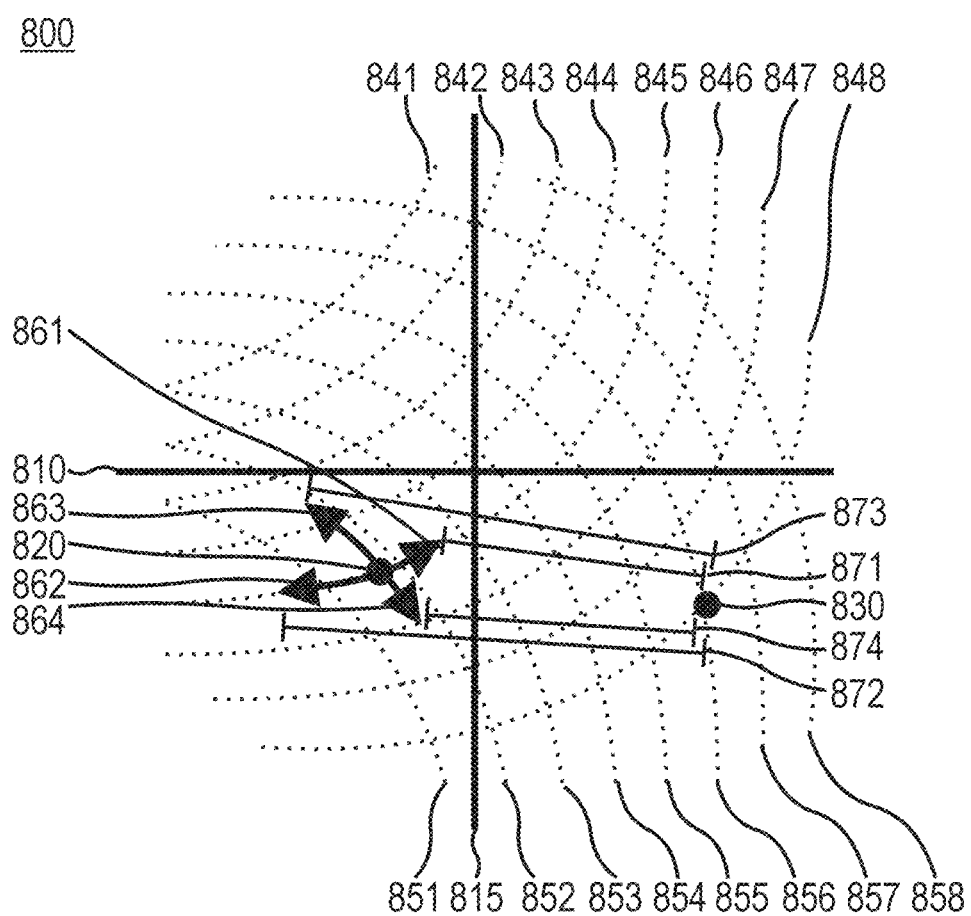
FIG. 8 is an illustration of a step in an embodiment digital algorithm for actuating the tunable microwave network in FIG. 4.

Now that an example method for generating a set of reflection coefficients has been described, we describe an algorithm that can be used by the digital processor 360 to actuate the tunable capacitive elements to select a tunable microwave network reflection coefficient which provides substantial attenuation of transmit signal energy at the receiving element input. Often, actuation of RF front-end components such as the proposed tunable microwave network is conducted using information in the digital baseband receive signals, such as the outputs I_BB_RX and Q_BB_RX of the ADCs 357i and 357q in FIG. 3, respectively. This actuation can also be conducted using information contained in other signals, but doing so might require additional analog circuit components and can sometimes be less desirable than using information in the digital baseband receive signals. One example method for utilizing information in digital baseband receive signals to drive the inputs of the tunable microwave network is depicted in FIG. 8. The axes 810 and 815 of FIG. 8 represent the real and imaginary axes, respectively, of the Γ-plane 800. Point 820 represents the current reflection coefficient of the tunable microwave network, while point 830 represents the point of the tunable microwave network where transmit signal energy at the input of the receiving element is attenuated as much as possible. Curves 841-848 represent a set of the reflection coefficients traced out by sweeping a first tunable capacitive element while keeping a second tunable capacitive element held constant. Curves 851-858 represent a set of the reflection coefficients traced out by sweeping the second tunable capacitive element while keeping the first tunable capacitive element held constant.

Assuming that a substantial portion of the transmit signal energy (from the transmit reflection signal F.S. and the transmit leakage signal L.S.) remains in the analog baseband receive signals after filtering by the filters 355i and 355q (which would likely be the case if the filters 355i and 355q were strictly low-pass filters), a substantial portion of the transmit signal energy can be made to remain in the digital baseband receive signals. The digital processor 360 can apply further filtering in order to isolate the transmit signal at digital baseband from other signals present in the outputs of the ADCs 357i and 357q. Since the magnitude of the transmit signal energy at digital baseband is proportional to the geometric distance between points 820 and 830 on the reflection coefficient place, the digital processor 360 can actuate the first tunable capacitive element 420 of the tunable microwave network 400 upwards or downwards to perturb the current reflection coefficient in a positive and negative manner along curves 841-848, as depicted by arrows 861-862. In each of the positive and negative perturbations, the transmit signal at digital baseband will deviate from its original value at point 820. If the magnitude of the transmit signal at digital baseband, represented by the line segment 871, is reduced at arrow 861 over that at the point at 820, the digital processor 360 can elect to retain the tuning setting at arrow 861 and subsequently undertake a similar perturbation process for the second tunable capacitive element 440. Similarly, if the magnitude of the transmit signal at digital baseband, represented by the line segment 872, is reduced at arrow 862 over that at the point at 820, the digital processor 360 can elect to retain the tuning setting at arrow 862 and subsequently undertake a similar perturbation process for the second tunable capacitive element. This process can continue until the actual reflection coefficient of the tunable microwave network substantially converges to a reflection coefficient that allows for the substantial attenuation of transmit signal energy at the receiving element input. A flow chart 900 depicting an example algorithm that makes use of the strategy depicted in FIG. 8 for two capacitors $C_1$ and $C_2$ is provided in FIG. 9.

Figure 10:
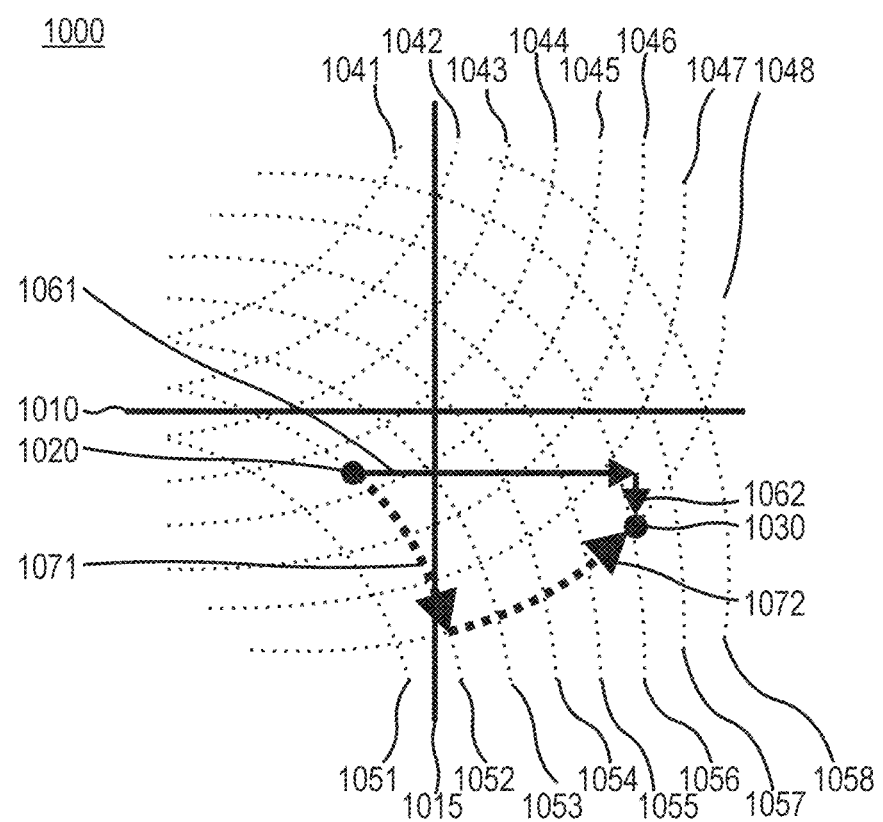
FIG. 10 is an illustration of a step in an embodiment digital algorithm for actuating the tunable microwave network in FIG. 4.

In the aforementioned process, the digital processor 360 actuated the first and second tunable capacitive elements without using direct knowledge of the mapping between the tunable capacitive element settings and the reflection coefficient of the tunable microwave network. As such, it effectively derives the local gradient of said mapping on the fly using the perturbations depicted by arrows 861-864. Since each perturbation takes one algorithmic iteration, each algorithmic step takes at least four algorithmic iterations. It may be desirable to further reduce the number of algorithmic iterations per algorithmic step. If some information regarding the local gradient of the mapping between the tunable capacitive element control inputs and the Γ-plane is known beforehand, the algorithm depicted in FIG. 10 can perform each algorithmic step in one algorithmic iteration. Again, axes 1010 and 1015 represent the real and imaginary axes, respectively, of the Γ-plane 1000. Point 1020 represents the current reflection coefficient of the tunable microwave network, while point 1030 represents the point of the tunable microwave network where transmit signal energy at the input of the receiving element is attenuated as much as possible. Curves 1041-1048 represent a set of the reflection coefficients traced out by sweeping a first tunable capacitive element while keeping a second tunable capacitive element held constant. Curves 1051-1058 represent a set of the reflection coefficients traced out by sweeping the second tunable capacitive element while keeping the first tunable capacitive element held constant.

Figure 9:
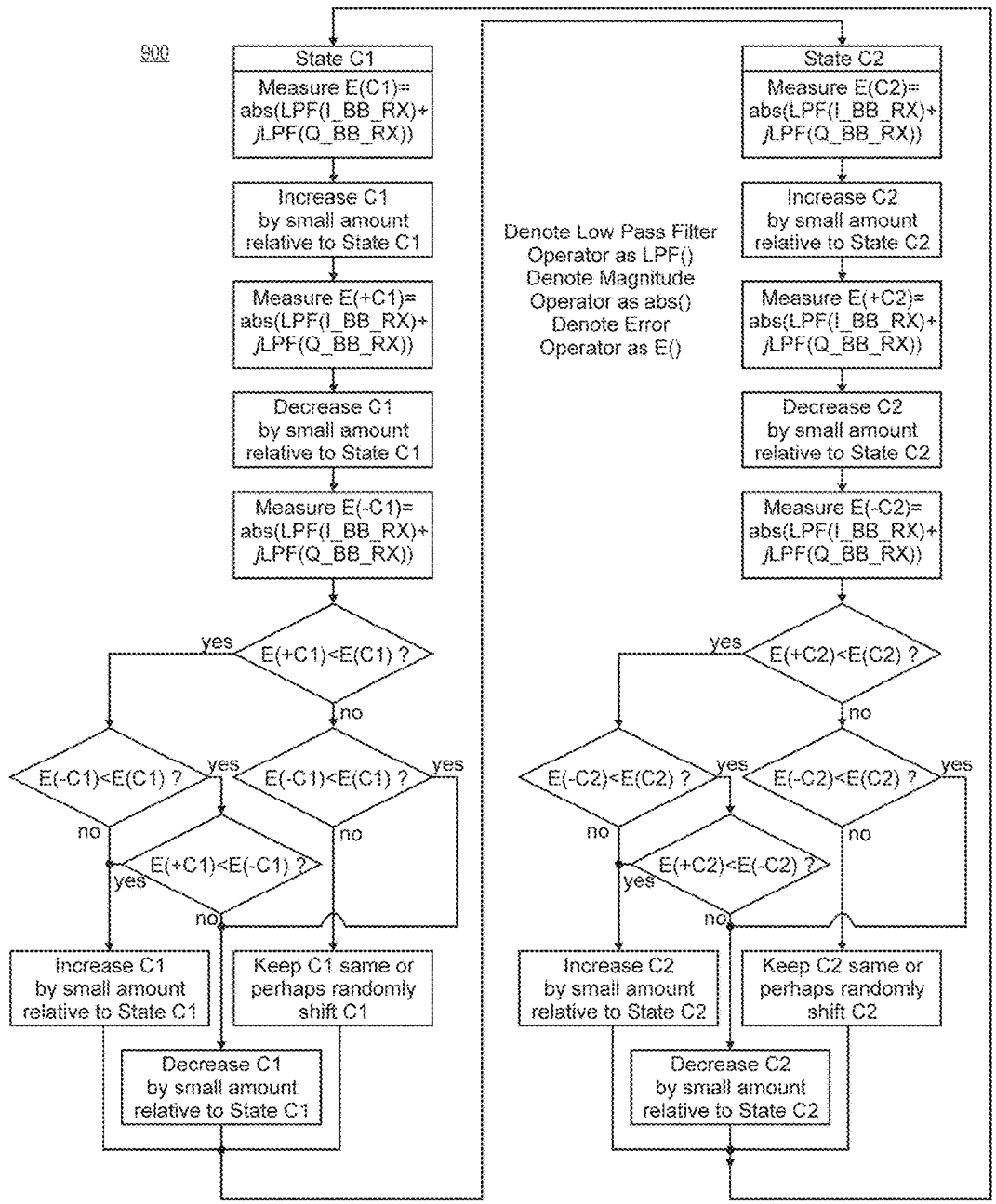
FIG. 9 is a flow chart of an embodiment digital algorithm for actuating the tunable microwave network in FIG. 4.

As in the algorithm described in conjunction with FIG. 8 and FIG. 9, the digital processor 360 can use the transmit signal present within the digital baseband signal to determine how to actuate the tunable capacitive elements so that the geometric distance between points 1020 and 1030 is substantially reduced, corresponding to a substantial attenuation of the transmit signal energy at the receiving element input. In this embodiment of a cancellation algorithm, the processor uses both in-phase and quadrature components of the transmit signal at digital baseband rather than just the magnitude. The in-phase and quadrature components of the transmit signal at digital baseband are roughly proportional to the real and imaginary components of the geometric difference between point 1020 and point 1030, denoted $\Delta\Gamma_r$ and $\Delta\Gamma_i$ and depicted as lines 1061 and 1062 in FIG. 10, respectfully. The proportionality in this case will be complex in nature; namely, there will be a phase difference in addition to a magnitude proportionality. If the phase difference is known, it can be incorporated into the aforementioned gradient mapping. To simplify the description herein, it will be assumed without loss of generality that this phase difference is zero.

Figure 11:
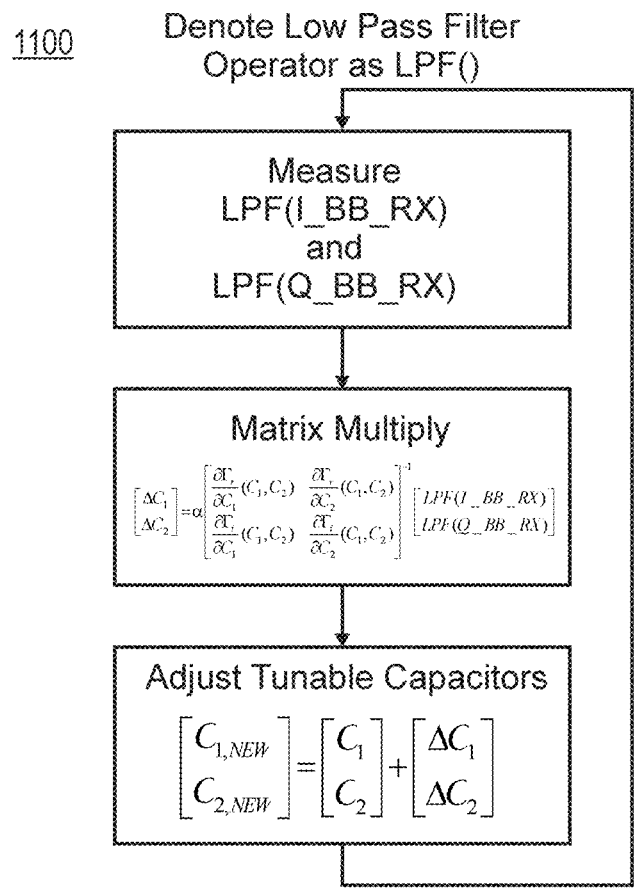
FIG. 11 is a flow chart of an embodiment digital algorithm for actuating the tunable microwave network in FIG. 4.

An analytical approach to developing a gradient mapping in the Γ-plane is as follows: Denoting the capacitance of the first and second tunable capacitive elements as $C_1$ and $C_2$, respectively, the mapping between the Γ-plane and the hyperspace defined by the realizable values of the tunable capacitive elements is given by the function $\Gamma(C_1, C_2) = \Delta\Gamma_r(C_1, C_2) + j\Delta\Gamma_i(C_1, C_2)$. Although it may seem that a processor can immediately find $C_{1,opt}$ and $C_{2,opt}$ based on the knowledge of $\Gamma(C_1, C_2)$, $C_1$, $C_2$, $\Delta\Gamma_r$ and $\Delta\Gamma_i$, hence moving directly across curves 1071 and 1072 in FIG. 10, doing so can be difficult due to errors in the knowledge of the aforementioned quantities and because looking up $C_{1,opt}$ and $C_{2,opt}$ from inverse functions $C_1 = f_1^{-1}(\Gamma_r, \Gamma_i)$ and $C_2 = f_2^{-1}(\Gamma_r, \Gamma_i)$ can be computationally expensive. It may be advantageous to instead employ an iterative algorithm in which relatively small steps $\Delta C_1$ and $\Delta C_2$ are successively computed based on measurements of $\Delta\Gamma_r$ and $\Delta\Gamma_i$ using the relation:

$$\begin{bmatrix} \Delta C_1 \\ \Delta C_2 \end{bmatrix} = \alpha \begin{bmatrix} \frac{\partial \Gamma_r}{\partial C_1}(C_1, C_2) & \frac{\partial \Gamma_r}{\partial C_2}(C_1, C_2) \\ \frac{\partial \Gamma_i}{\partial C_1}(C_1, C_2) & \frac{\partial \Gamma_i}{\partial C_2}(C_1, C_2) \end{bmatrix}^{-1} \begin{bmatrix} \Delta\Gamma_r \\ \Delta\Gamma_i \end{bmatrix}$$

$$\begin{bmatrix} \Delta C_1 \\ \Delta C_2 \end{bmatrix} = \alpha J^{-1} \begin{bmatrix} \Delta\Gamma_r \\ \Delta\Gamma_i \end{bmatrix}$$

where $J^{-1}$ is the inverse of the Jacobian matrix of the function $\Gamma(C_1, C_2)$ and $\alpha$ is a convergence constant. This inverse Jacobian matrix can be computed a priori and stored in a memory element of the processor such that its elements can be accessed by the iterative algorithm. For each $\Delta\Gamma$ the processor computes a new $\{\Delta C_1, \Delta C_2\}$ pair and adds it to the previous capacitive element values $\{C_1, C_2\}$. After the system settles, a new value of $\Delta\Gamma$ is available for analysis at digital baseband and yet another $\{\Delta C_1, \Delta C_2\}$ value is generated. If the system is designed properly, this process continues until $\Delta\Gamma$ reaches a minimum and $\{\Delta C_1, \Delta C_2\} = \{0, 0\}$. Sometimes an oscillatory solution is encountered whereby $\{\Delta C_1, \Delta C_2\} \neq \{0, 0\}$ but rather a repeating set of small values. In such a case, the magnitude of $\Delta\Gamma$ may still be small enough to be acceptable for proper decoding of the received tag backscatter signal. A flow chart 1100 depicting an example algorithm that makes use of the strategy depicted in FIG. 10 for two capacitors $C_1$ and $C_2$ is provided in FIG. 11.

Figure 12:
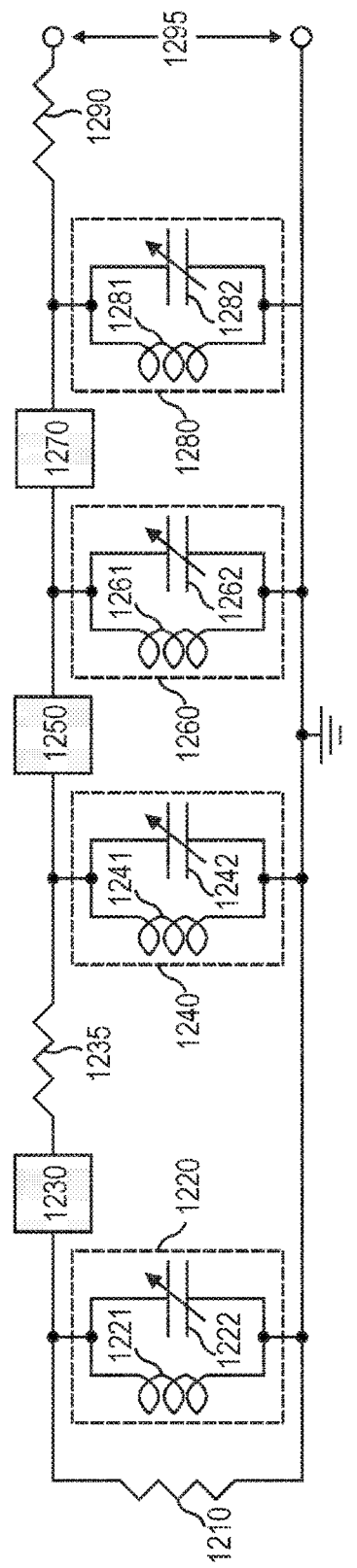
FIG. 12 is a schematic of an embodiment tunable microwave network.
Figure 13:
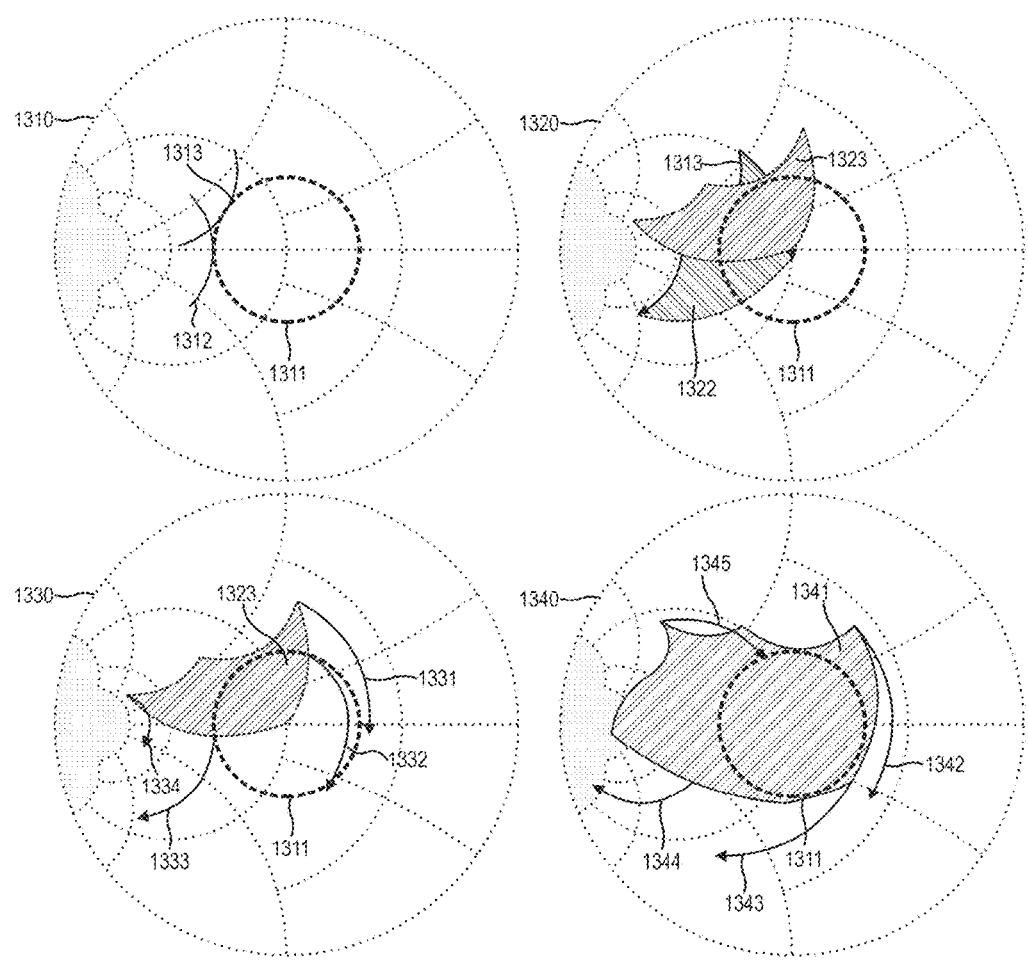
FIG. 13 is a series of graphs depicting the tunable microwave network in FIG. 12 achieving coverage of reflection coefficients within a predetermined set of reflection coefficients.

FIG. 12 depicts another embodiment of a tunable microwave network suitable for use in the system of FIG. 3. In this embodiment, tunable capacitive elements 1220, 1240, 1260, and 1280 are again coupled to the network in a shunt configuration and are still separated by series phase shifting elements 1230, 1250, and 1270. A shunt resistor 1210 serves as the static load that shifts the starting reflection coefficient immediately to the left of the circle near the center of the Γ-plane that is to be filled with realizable reflection coefficients. In this embodiment, low maximum error distance between reflection coefficients is not achieved through the use of subranging tunable capacitive elements as in FIG. 4. Rather, as depicted in FIG. 13, the circuit of FIG. 12 can be thought of as generating a dense set of reflection coefficients in the center of the Γ-plane by repeatedly sweeping clockwise arcs and rotating the constellation of the reflection coefficients through the Γ-plane.

In subplot 1310, the target set of reflection coefficients to be covered resides on the disc enclosed by circle 1311. Curve 1312 represents the set of reflection coefficients realizable by the network to the left of the first phase shifting element 1230 in FIG. 12. In this particular embodiment, the first phase shifting element 1230 has a phase shift of 15 degrees. From the perspective of a network connected to the right side of the first phase shifting element 1030, the set of reflection coefficients in curve 1312 appear rotated clockwise by 30 degrees around the center of the Γ-plane, as depicted by curve 1313. Neglecting the effect of resistor 1235, which has the effect of pushing the points on curve 1313 slightly towards the point (1,0) in the Γ-plane, the reflection coefficients realizable by the network to the left or to the right of phase shifting element 1250 are depicted in admittance Smith Chart 1320. Cross-hatched area 1322 represents the set of reflection coefficients realizable by the network to the left of the phase shifting element 1250. It should be noted that sweeping the capacitance of the tunable capacitive element 1240 upwards results in the generation of new points in an area defined by counterclockwise arcs emanating from curve 1313 along the circles contained within admittance Smith Chart 1320. After a rotation by the phase shifting element 1250, the set of realizable reflection coefficients realizable by the network with input at the right of the phase shifting element 1250 is depicted as cross-hatched area 1323. Increasing the capacitance of the tunable capacitive element 1260 results in critical points on cross-hatched area 1323 tracing arcs 1331-1334 in admittance Smith Chart 1330. The resulting set of realizable reflection coefficients after another 30 degree rotation by the phase shifting element 1270 is depicted as cross-hatched area 1341 in admittance Smith Chart 1340. It is evident that coverage of the disc enclosed by circle 1311 has already been achieved and the reflection coefficient expansion produced by the capacitive sweep of the tunable capacitive element 1280 and depicted by arcs 1341-1345 merely adds more realizable reflection coefficients to the disc enclosed by circle 1311, in all likelihood reducing the maximum error distance of the network. Finally, resistor 1290 shifts the set of realizable reflection coefficients to the right of admittance Smith Chart 1320, while port 1295 represents the connection of this example tunable microwave network to directional coupler 330.

Figure 14:
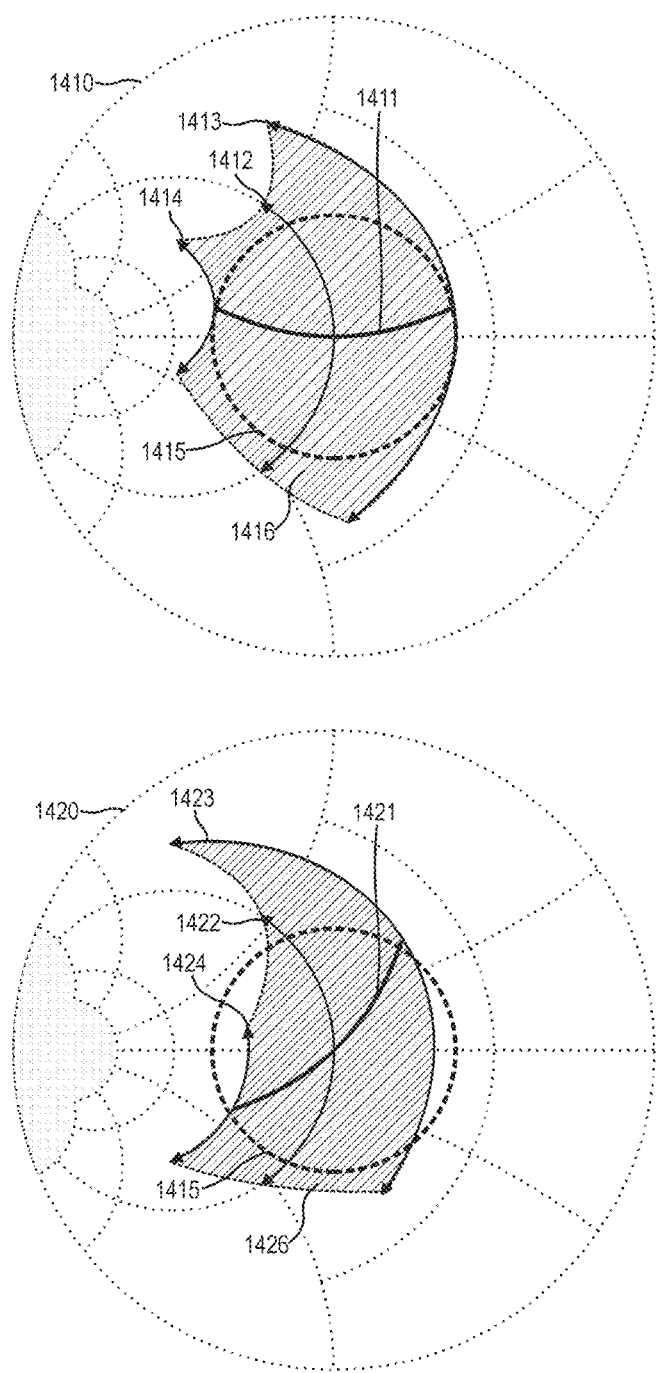
FIG. 14 is a pair of graphs depicting a lower phase shift guideline for phase shifting elements within the tunable microwave network in FIG. 12.

As in the embodiment of FIG. 4, the clockwise arc sweeps in the Γ-plane are realized by sweeping the value of the shunt capacitances larger, while the constellation rotations are realized by the phase shifting elements. It was found that in a particular condition of interest, acceptably low maximum error distance results could be achieved with the network topology of FIG. 12 with phase shifts from 10 to 60 degrees, with best results ranging from 15 to 30 degrees, but it is conceivable that other phase shift ranges could also function satisfactorily. For sets of reflection coefficients to be realized in the center of the Γ-plane, a lower bound on the phase shift per phase shifting element in a close-to-optimal tunable microwave network can be visualized with the aid of FIG. 14. FIG. 14 considers only the first sweep, first rotation, and last sweep of the tunable microwave network. It is shown in admittance Smith Chart 1410 that if the center of the arc 1411 originally traced by the first sweep is rotated by all the phase shifting elements to be substantially orthogonal to the circles contained within the admittance Smith Chart, then the cross-hatched area 1416 covered by the plurality of points generated during the final sweep of the points will completely cover circle 1411. Note that arc 1411 is analogous to points 641-645 of FIG. 6 after being rotated to the real axis of the Γ-plane. A similar plot is shown in admittance Smith Chart 1420 in which the sum of all angles of rotations prior to the last sweep is substantially less than that required to ensure that the arc traced by the first sweep is substantially tangent to the real axis of the Γ-plane when the center of the arc touches the real axis. In this case, it is clear that the area covered by the entire set of realizable reflection coefficients will not only not cover the disc enclosed by circle 1415, but the network corresponding to admittance Smith Chart 1420 will place a large proportion of reflection coefficients outside of circle 1415, rendering the tunable microwave network relatively inefficient for covering said circle. It can be therefore inferred from admittance Smith Charts 1410 and 1420 that efficient realizable reflection coefficient coverage of a circle at the center of the Γ-plane can be achieved if the arc on the Γ-plane traced by the first tunable capacitive element sweep, when rotated by the sum of all of the phase shifts in the tunable matching network, is substantially orthogonal to the circles contained within the admittance Smith Chart. It follows that if the sum of less than all of the phase shifts in the tunable matching network results in a substantial orthogonality between the aforementioned arc and the circles contained within the admittance Smith Chart, then such a network can also achieve efficient coverage of a disc enclosed by a circle such as circle 1415. Hence, the bound on the sum of all of the phase shifts is a lower bound.

For the case in which the tunable microwave network is designed to cover a disc centered at the origin with realizable reflection coefficients, the exact phase shift angle required to achieve orthogonality between the first curve and the circles contained within the admittance Smith Chart depends on the radius of the disc to be covered. This can be seen clearly in FIG. 6 where for circle 620 with radius of 0.3, the phase shift needed to achieve orthogonality between the circles and the first curve comprised of points 641-645 is substantially similar to 22.5 degrees, resulting in a rotation angle of 45 degrees. If the radius of circle 620 were smaller, for example, 0.15, it is evident that the required phase shift to achieve orthogonality with the circles would be slightly greater, perhaps 30 degrees, resulting in a rotation angle of 60 degrees. As the radius of circle 620 approaches zero, the required phase shift approaches 45 degrees, resulting in a rotation angle of 90 degrees.

To conclude, a lower bound on the phase shift per phase shifting element depends on the number of phase shifting elements, the radius of the circle to be covered with realizable reflection coefficients, and the fraction of realizable reflection coefficients required to exist within the circle of interest. On the one hand, a small circle radius translates into a larger rotation requirement to achieve orthogonality. On the other hand, a small circle radius is more forgiving to a suboptimal choice of rotation angle at the cost of a lower fraction of realizable reflection coefficients residing in the circle of interest, as seen in admittance Smith Chart 1420. It was found that to obtain acceptable results for circles near the center of the admittance Smith Chart, a heuristic lower bound on phase shift per phase shifting element should be equal to about 30 degrees divided by a quantity substantially similar to the number of phase shifting elements plus one. In other words, this lower bound is equal to about 30 degrees divided by the number of tunable capacitive elements.

Figure 15:
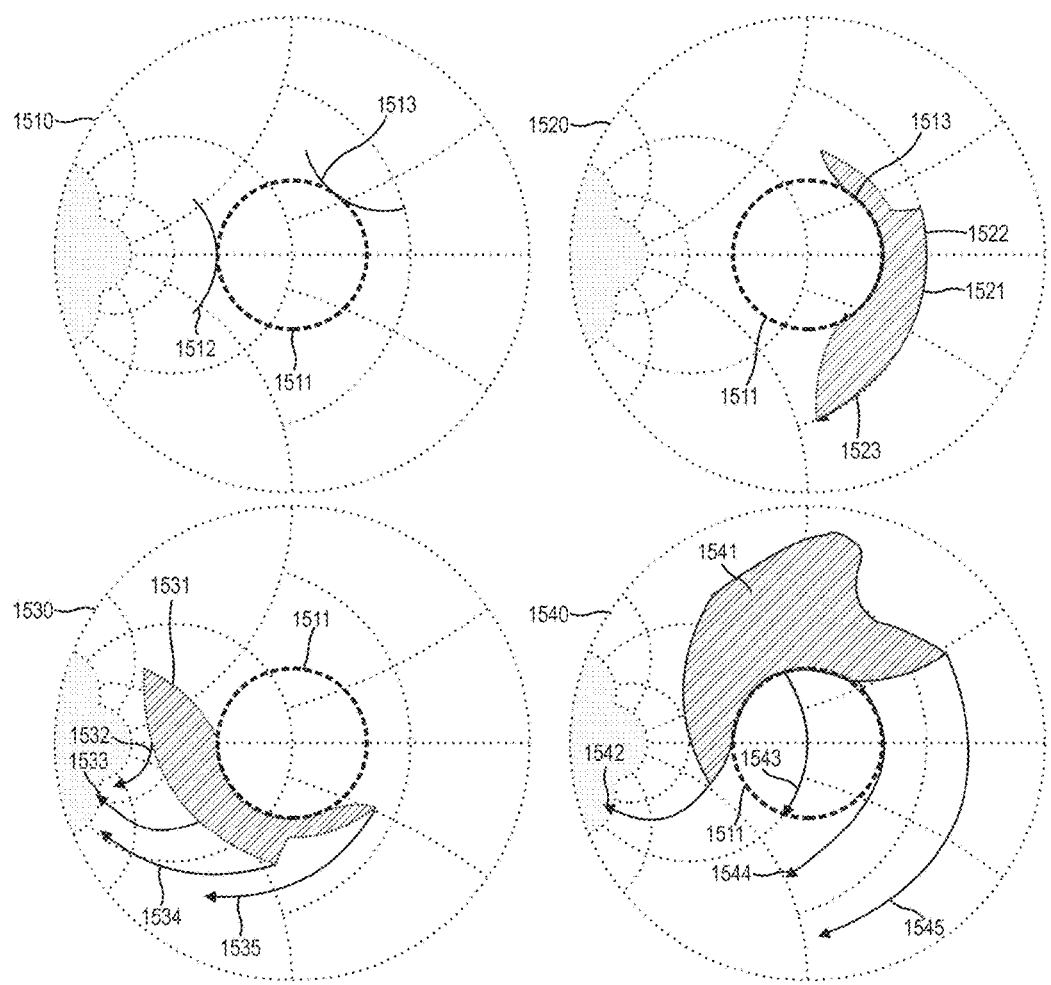
FIG. 15 is a series of graphs depicting an upper phase shift guideline for phase shifting elements within the tunable microwave network in FIG. 12.

For sets of reflection coefficients to be realized in the center of the Γ-plane, an upper bound on the phase shift per phase shifting element in a close-to-optimal tunable microwave network can be visualized with the aid of FIG. 15. In this exercise, the phase shifting elements each have phase shifts of 60 degrees, corresponding to admittance Smith Chart rotations of 120 degrees. Admittance Smith Chart 1510 in FIG. 15 depicts a first rotation of approximately 120 degrees between arcs 1512 and 1513, with the reflection coefficients of arc 1513 representing the realizable reflection coefficients of the network to the left of resistor 1235. In admittance Smith Chart 1520, the effects of the second capacitive sweep are depicted, with most realizable reflection coefficients of the network to the left of phase shifting element 1250 hugging the right side of circle 1511. In admittance Smith Chart 1530, the subsequent rotation and sweep by phase shifting element 1250 and tunable capacitive element 1260 generate an amorphous area implied by cross-hatched area 1531 and sweep-related arcs 1532-1535. In graph 1540, the subsequent rotation and sweep finally brings realized reflection coefficients into circle 1511, but as depicted in graph 1550, does so in an inefficient manner with the majority of the points falling outside of circle 1511 and with circle 1511 only marginally filled with realized reflection coefficients. Due to this marginality, we can consider 60 degrees to be a heuristic upper bound on phase shift per phase shifting element. This result should be compared to that in FIG. 13 in which much smaller rotations result in keeping the set of realized reflection coefficients close to the center of the admittance Smith Chart at all times, eventually yielding a compact pattern of reflection coefficients centered near the origin of the Γ-plane. Design experience reveals that the largest phase shift per phase shifting element that yields good coverage of the disc enclosed by a circle of radius 0.3 in the Γ-plane is 45 degrees, for a rotation of 90 degrees. As shown in FIG. 6, for a one-phase shifting element tunable matching network a rotation of 90 degrees will leave part of the disc of interest uncovered by realizable reflection coefficients. However, in this particular embodiment, a slightly smaller disc can be completely covered with larger phase shifts per phase shifting element provided that the other network component values are appropriately adjusted.

Figure 16:
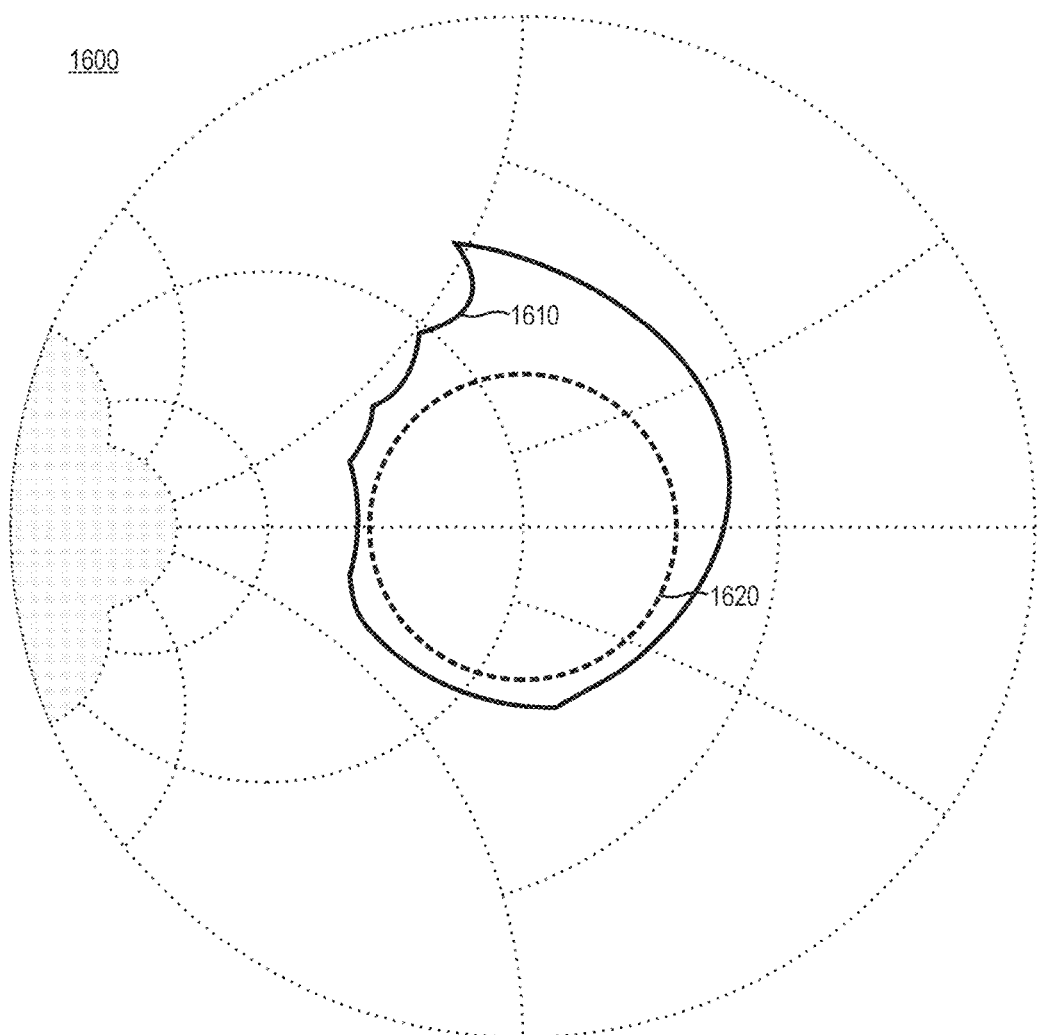
FIG. 16 is a graph illustrating the coverage of reflection coefficients achieved by an embodiment of the tunable microwave network in FIG. 12.

Boundary 1610 in FIG. 16 circumscribes the set of all discrete reflection coefficients realized by an embodiment tunable microwave network of the architecture depicted in FIG. 12. As one can see, roughly half of the area circumscribed by boundary 1610 is occupied by the predetermined set of reflection coefficients contained within dashed circle 1620, which is a circle centered at the origin with a radius of 0.3. Given that it is advantageous for boundary 1610 to circumscribe dashed circle 1620 by some margin due to frequency-dependent shifts of the reflection coefficients, this result implies tight coverage of the predetermined set of reflection coefficients by the exemplary tunable microwave network design.

Although the examples described here attempt to cover circular regions centered at the origin in the Γ-plane, other shapes and other positions may be targeted in other embodiments. Thus, other configurations of components can also be used.

The methods, systems, and apparatuses described herein can be implemented in various electronic devices such as hardware circuitry, single or multiprocessor circuits, memory circuits, software program modules and objects, firmware, and/or combinations thereof. Data can be stored in memory elements such as read-only memory (ROM), random access memory (RAM), magnetic disk storage mediums, optical storage mediums, flash memory devices and/or other machine-readable mediums, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium," "computer-readable medium," and/or "processor-readable medium" and executed by one or more processors, machines and/or devices.

Further, the methods, systems, and apparatuses described herein can be implanted with various consumer products such as a mobile phone (for example, a smart phone), a tablet computer, laptop computer, a personal digital assistant (PDA), a wrist watch, etc.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language does not imply that features, elements and/or states are in any way required for one or more embodiments or that one or more embodiments necessarily include logic for deciding, with or without author input or prompting, whether these features, elements and/or states are included or are to be performed in any particular embodiment.

The teachings provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present disclosure is defined only by reference to the appended claims.

What is claimed is:

1. A radio transceiver which concurrently transmits and receives comprising:
an antenna;
a directional coupler comprising an input port, a transmitted port, a coupled port, and an isolated port, the transmitted port being operatively coupled to the antenna;
a signal source operatively coupled to the input port to provide an output signal through the antenna;
a signal receiver operatively coupled to the isolated port to receive an input signal from the antenna;

a tunable microwave network operatively coupled to the coupled port, the tunable microwave network comprising:
  a phase shifting element operatively coupled to the coupled port;
  a first tunable capacitive element operatively coupled to the coupled port through the phase shifting element in a shunt configuration between the phase shifting element and ground; and
  a second tunable capacitive element operatively coupled to the coupled port, in a shunt configuration between the phase shifting element and ground,
  wherein at least one of the first tunable capacitive element and the second tunable capacitive element comprises:
    a coarse tunable capacitive element;
    a fine tunable capacitive element subranging the coarse tunable capacitive element; and
    an impedance transforming network,
      wherein the fine tunable capacitive element is electrically coupled to said tunable microwave network through the impedance transforming network; and
a control unit configured to adjust a capacitance of the first and second tunable capacitive elements.

2. The radio transceiver which concurrently transmits and receives of claim 1, wherein the antenna, directional coupler, signal source, signal receiver, tunable microwave network, and control unit are physically attached to form a single physical unit.

3. The radio transceiver which concurrently transmits and receives of claim 1, wherein the phase shifting element is directly coupled to the coupled port.

4. The radio transceiver which concurrently transmits and receives of claim 1, wherein the phase shifting element comprises a phase shift greater than 30 degrees divided by a quantity substantially similar to the total number of tunable capacitive elements and less than 60 degrees at a predetermined frequency.

5. The radio transceiver which concurrently transmits and receives of claim 4, wherein the phase shifting element comprises a phase shift at a predetermined frequency between 15 degrees and 30 degrees.

6. The radio transceiver which concurrently transmits and receives of claim 1, wherein the tunable microwave network further comprises a static load having a complex impedance coupled to the first tunable capacitive element.

7. The radio transceiver which concurrently transmits and receives of claim 1, wherein at least one of the first tunable capacitive element and the second tunable capacitive element comprises a digitally tunable capacitor.

8. The radio transceiver which concurrently transmits and receives of claim 1, wherein the phase shifting element comprises a microstrip transmission line.

9. The radio transceiver which concurrently transmits and receives of claim 1, wherein the phase shifting element comprises a lumped transmission line or subsection thereof.

10. The radio transceiver which concurrently transmits and receives of claim 1, wherein the phase shifting element comprises an inductor disposed in series between the first tunable capacitive element and the second tunable capacitive element.

11. The radio transceiver which concurrently transmits and receives of claim 1, wherein the impedance transforming network comprises an inductive transformer.

12. The radio transceiver which concurrently transmits and receives of claim 11, further comprising a resonating capacitive element, the resonating capacitive element substantially resonating with a residual series inductance of the inductive transformer at an operating microwave frequency of the radio transceiver which concurrently transmits and receives, the resonating capacitive element coupled in series with the subranging tunable capacitive element.

13. The radio transceiver which concurrently transmits and receives of claim 1, wherein the impedance transforming network comprises an inductive divider.

14. The radio transceiver which concurrently transmits and receives of claim 13, further comprising a resonating capacitive element, the resonating capacitive element substantially resonating with a residual series inductance of the inductive divider at an operating microwave frequency of the radio transceiver which concurrently transmits and receives, the resonating capacitive element coupled in series with the subranging tunable capacitive element.

15. The radio transceiver which concurrently transmits and receives of claim 1, further comprising a fixed capacitive element, the fixed capacitive element disposed in series with said fine tunable capacitive element.

16. A method for operating a radio transceiver, the method comprising:
  emitting a first microwave signal through an antenna;
  receiving a second microwave signal with the antenna, the second microwave signal comprising a RFID tag signal generated in response to receiving the first microwave signal;
  receiving an intrinsic internal-reflection signal generated by other components of the RFID interrogator transceiver in response to the first microwave signal;
  measuring the combined received signal comprising the second microwave signal and the internal-reflection signal to estimate at least one component of the internal-reflection signal; and
  automatically adjusting at least two tunable capacitive elements, comprising a first tunable capacitive element and a second tunable capacitive element, operatively coupled to each other through a series phase shifting element and operatively coupled to the antenna to generate a cancelling internal-reflection signal to substantially attenuate the intrinsic internal-reflection signal in response to the first microwave signal, wherein at least one of the first tunable capacitive element and the second tunable capacitive element comprises:
  a coarse tunable capacitive element;
  a fine tunable capacitive element subranging the coarse tunable capacitive element; and
  an impedance transforming network,
  wherein the fine tunable capacitive element is electrically coupled to said tunable microwave network through the impedance transforming network.

17. The method of claim 16, wherein the step of measuring comprises estimating at least two components of the internal-reflection signal, the two components comprising an in-phase component and a quadrature component.

18. The method of claim 16, wherein the only measured component of the internal-reflection signal is a magnitude component.

19. The method of claim 16, wherein both of the first and second tunable capacitive elements comprise a coarse tunable capacitive element and a fine tunable capacitive element subranging the coarse tunable capacitive element.

20. A coupling means for coupling both a transmitting element output and a receiving element input to a common radiating element in such a fashion that the transmitting element output signal of said transmitting element output experiences substantial attenuation from said transmitting element output to said receiving element input, said substantial attenuation exceeding the attenuation from the common radiating element to said receiving element input, comprising:
- a directional coupler comprising an input port, a transmitted port, a coupled port, and an isolated port, the transmitted port being operatively coupled to the antenna;
- a tunable microwave network operatively coupled to the coupled port, the tunable microwave network comprising:
  - a phase shifting element operatively coupled to the coupled port;
  - a first tunable capacitive element operatively coupled to the coupled port through the phase shifting element in a shunt configuration between the phase shifting element and ground; and
  - a second tunable capacitive element operatively coupled to the coupled port, in a shunt configuration between the phase shifting element and ground,
  - wherein at least one of the first tunable capacitive element and the second tunable capacitive element comprises:
    - a coarse tunable capacitive element;
    - a fine tunable capacitive element subranging the coarse tunable capacitive element; and
    - an impedance transforming network,
    - wherein the fine tunable capacitive element is electrically coupled to said tunable microwave network through the impedance transforming network; and
- a control unit configured to adjust a capacitance of the first and second tunable capacitive elements.

* * * * *